(12) United States Patent
Inden

(10) Patent No.: US 11,380,704 B2
(45) Date of Patent: Jul. 5, 2022

(54) SEMICONDUCTOR MEMORY DEVICE AND METHOD OF MANUFACTURING SEMICONDUCTOR MEMORY DEVICE

(71) Applicant: Kioxia Corporation, Minato-ku (JP)

(72) Inventor: Tomoya Inden, Yokkaichi (JP)

(73) Assignee: Kioxia Corporation, Minato-ku (JP)

( * ) Notice: Subject to any disclaimer, the term of this patent is extended or adjusted under 35 U.S.C. 154(b) by 0 days.

(21) Appl. No.: 17/003,135

(22) Filed: Aug. 26, 2020

(65) Prior Publication Data

US 2021/0296327 A1    Sep. 23, 2021

(30) Foreign Application Priority Data

Mar. 19, 2020  (JP) .............................. JP2020-049442

(51) Int. Cl.

| H01L 27/1157 | (2017.01) |
|---|---|
| H01L 21/8238 | (2006.01) |
| H01L 29/423 | (2006.01) |
| H01L 27/11565 | (2017.01) |
| H01L 27/11582 | (2017.01) |
| H01L 29/66 | (2006.01) |
| H01L 29/792 | (2006.01) |
| H01L 27/11573 | (2017.01) |

(52) U.S. Cl.
CPC .... *H01L 27/1157* (2013.01); *H01L 27/11565* (2013.01); *H01L 27/11573* (2013.01); *H01L 27/11582* (2013.01); *H01L 29/4234* (2013.01); *H01L 29/66833* (2013.01); *H01L 29/792* (2013.01)

(58) Field of Classification Search
CPC ........... H01L 27/1157; H01L 27/11565; H01L 27/11573; H01L 27/11582; H01L 29/4234; H01L 29/66833; H01L 29/792; H01L 21/8232; H01L 27/0922; H01L 21/823462; H01L 21/823842; H01L 27/092; H01L 27/11529; H01L 27/11531; H01L 29/66883
See application file for complete search history.

(56) References Cited

U.S. PATENT DOCUMENTS

| 9,406,694 B1 * | 8/2016 | Ikeno ................ H01L 29/66833 |
| 9,780,231 B1 * | 10/2017 | Li ....................... H01L 29/1087 |
| 10,797,072 B2 * | 10/2020 | Inatsuka ........... H01L 27/11565 |

(Continued)

FOREIGN PATENT DOCUMENTS

| JP | 2016-225434 A | 12/2016 |
| JP | 2021-44519 A | 3/2021 |

*Primary Examiner* — Shahed Ahmed
*Assistant Examiner* — Khatib A Rahman
(74) *Attorney, Agent, or Firm* — Oblon, McClelland, Maier & Neustadt, L.L.P.

(57) ABSTRACT

A semiconductor memory device includes a P-type transistor and a first N-type transistor. The P-type transistor includes a first semiconductor layer containing carbon, a P-type second semiconductor layer provided on the first semiconductor layer, a third semiconductor layer provided on the second semiconductor layer and containing carbon. The first N-type transistor includes a fourth semiconductor layer containing carbon, an N-type fifth semiconductor layer provided on the fourth semiconductor layer, a sixth semiconductor layer provided on the fifth semiconductor layer and containing carbon.

9 Claims, 27 Drawing Sheets

(56) References Cited

U.S. PATENT DOCUMENTS

| | | | |
|---|---|---|---|
| 2003/0094635 A1* | 5/2003 | Yaegashi | H01L 27/11529 257/E21.691 |
| 2004/0217431 A1* | 11/2004 | Shimada | H01L 29/513 257/E21.639 |
| 2016/0232976 A1* | 8/2016 | Inden | H01L 23/535 |
| 2019/0013323 A1* | 1/2019 | Bhattacharyya | H01L 29/4234 |
| 2020/0303383 A1* | 9/2020 | Kodama | H01L 21/823842 |
| 2020/0303406 A1* | 9/2020 | Komiya | H01L 29/1037 |
| 2021/0057446 A1* | 2/2021 | Sawabe | G11C 16/0483 |
| 2021/0082916 A1 | 3/2021 | Inden | |
| 2021/0313333 A1* | 10/2021 | Liaw | H01L 29/4966 |
| 2021/0358925 A1* | 11/2021 | Takahashi | H01L 29/40111 |

* cited by examiner

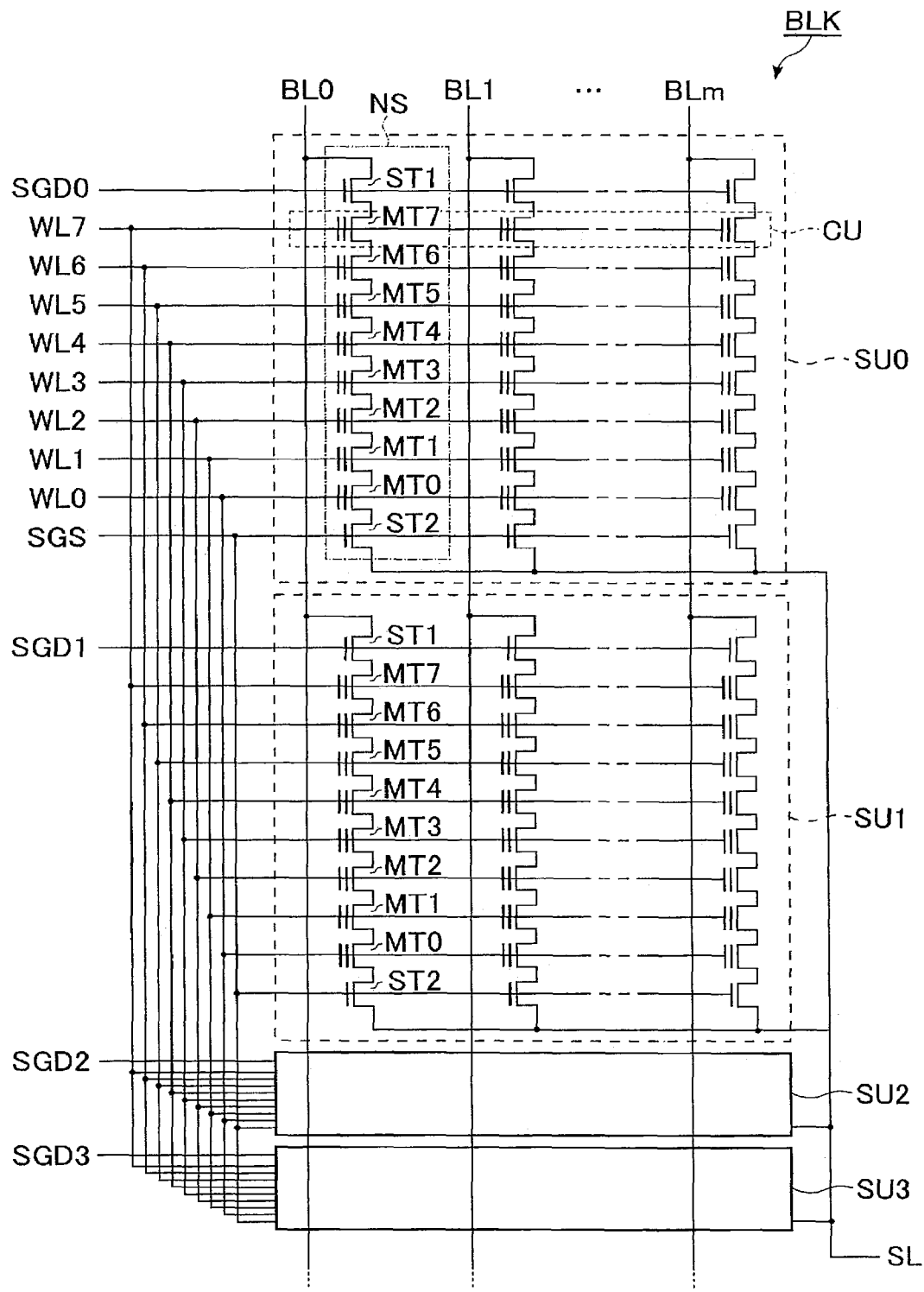
F I G. 2

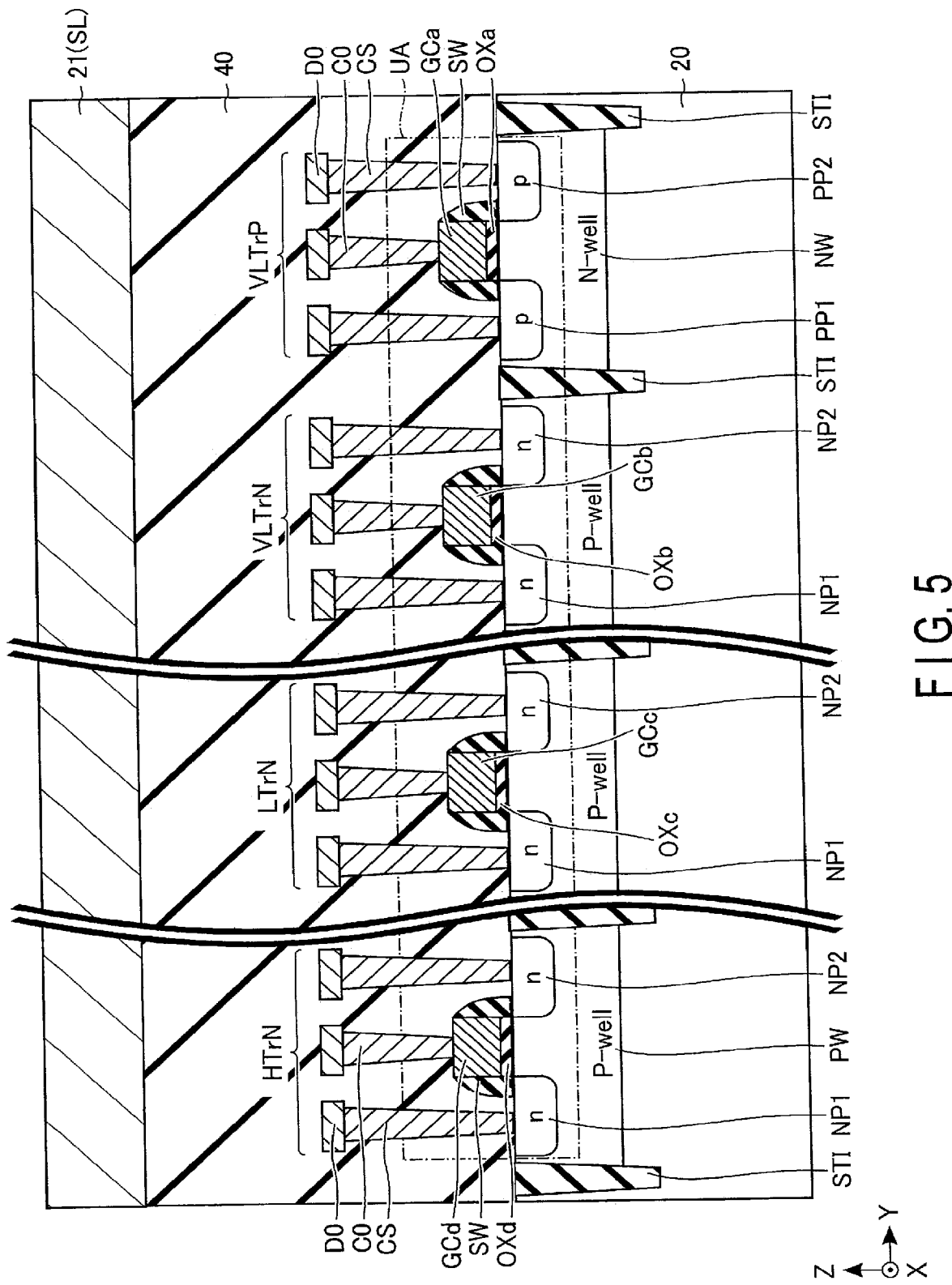
F I G. 5

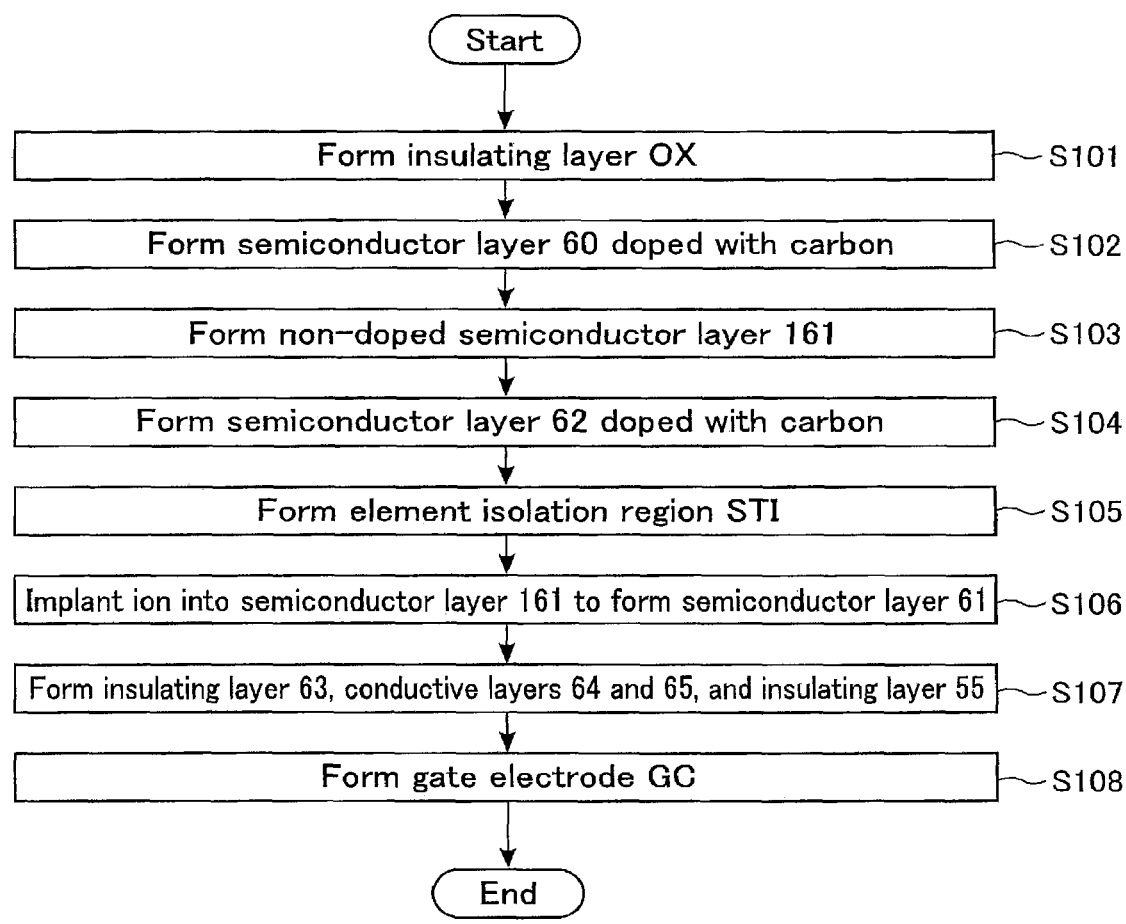
F I G. 10

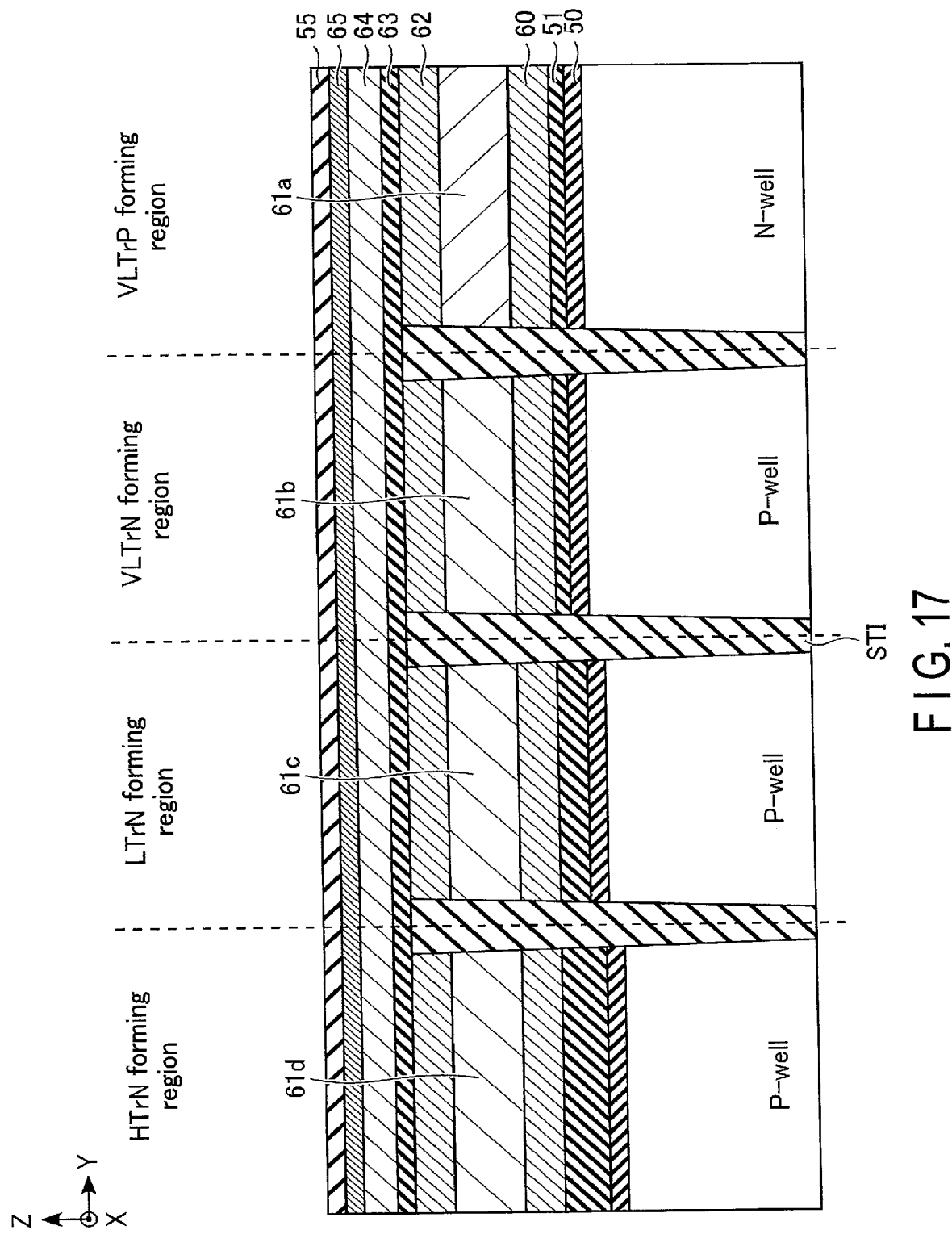
F I G. 17

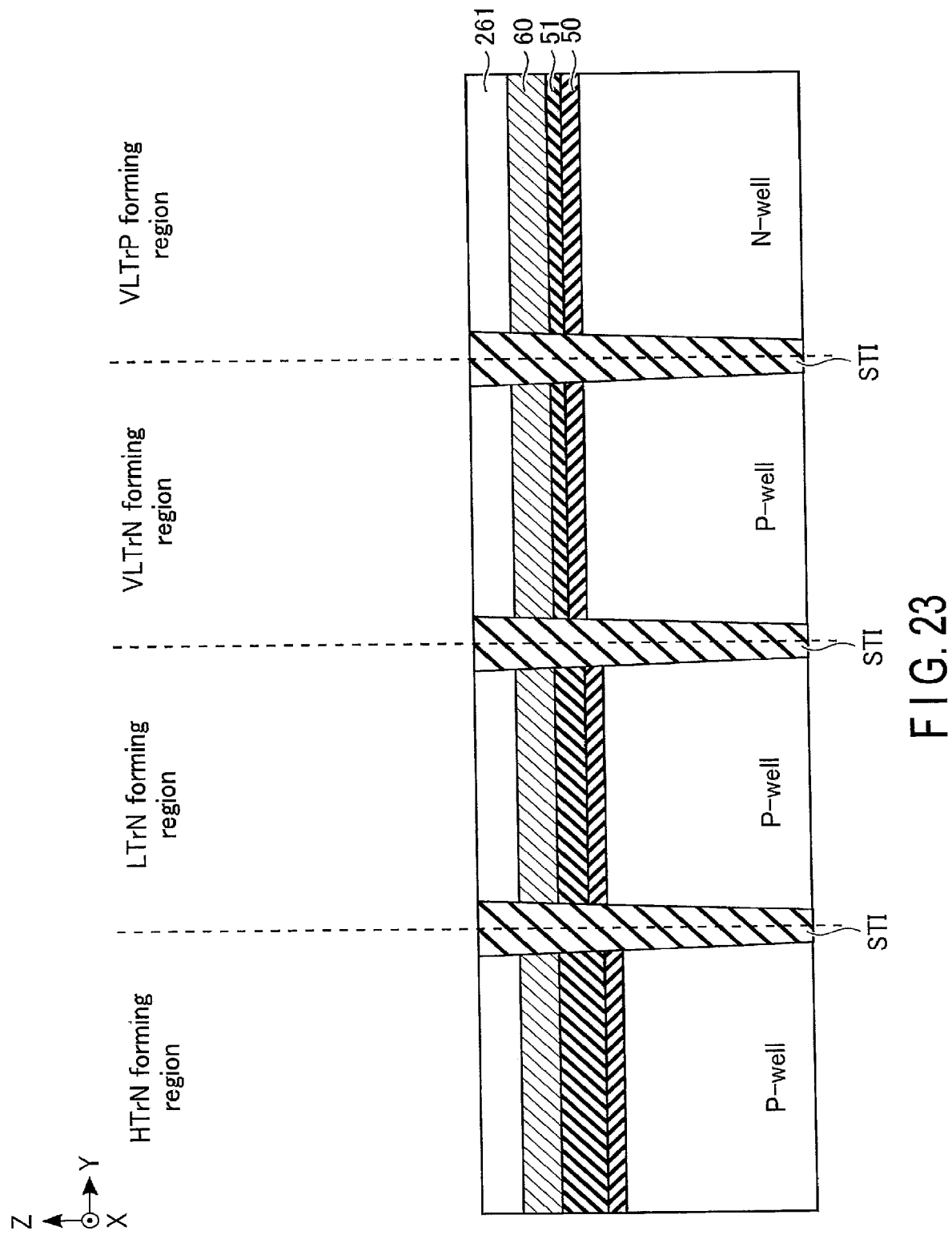
F I G. 23

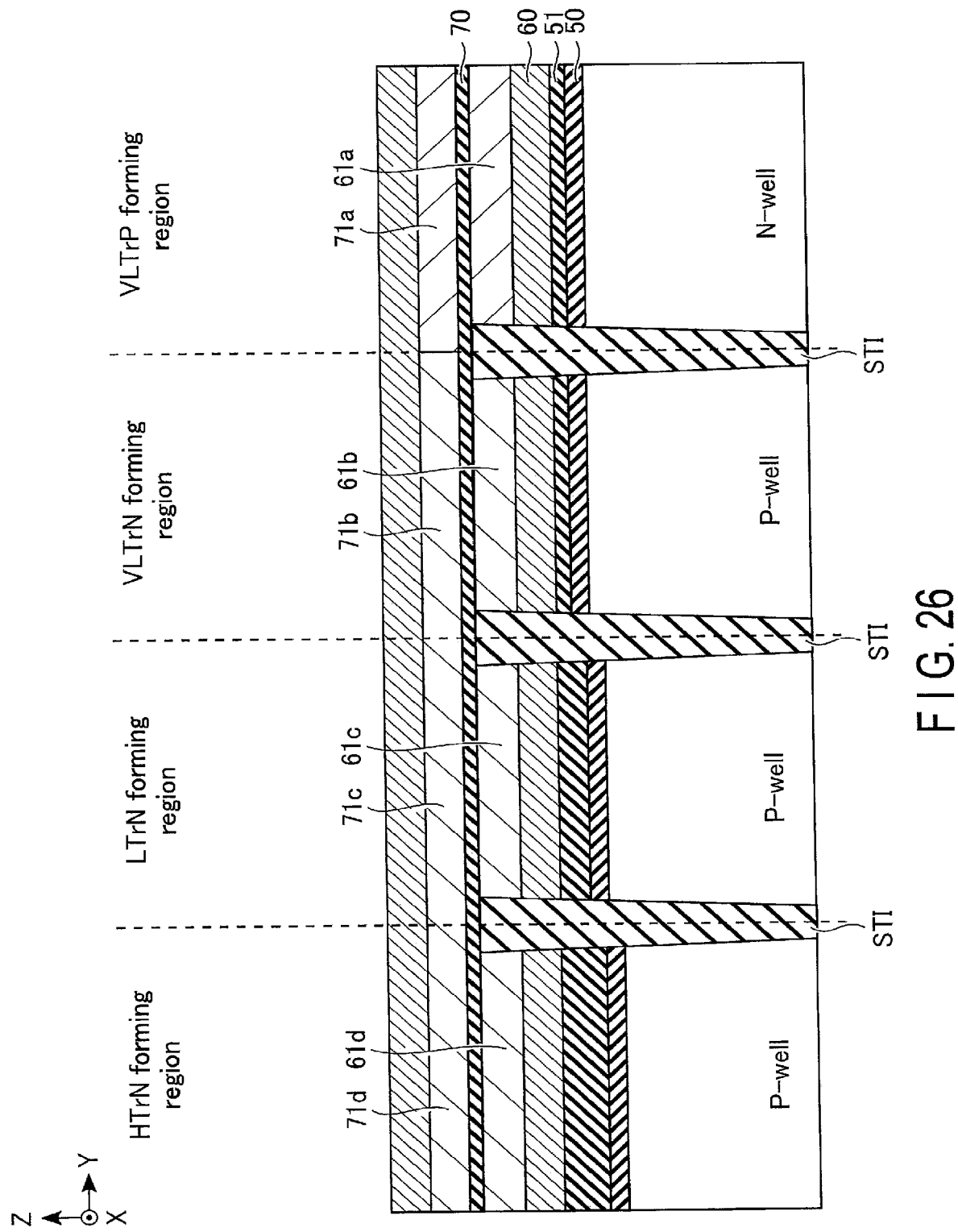
F I G. 26

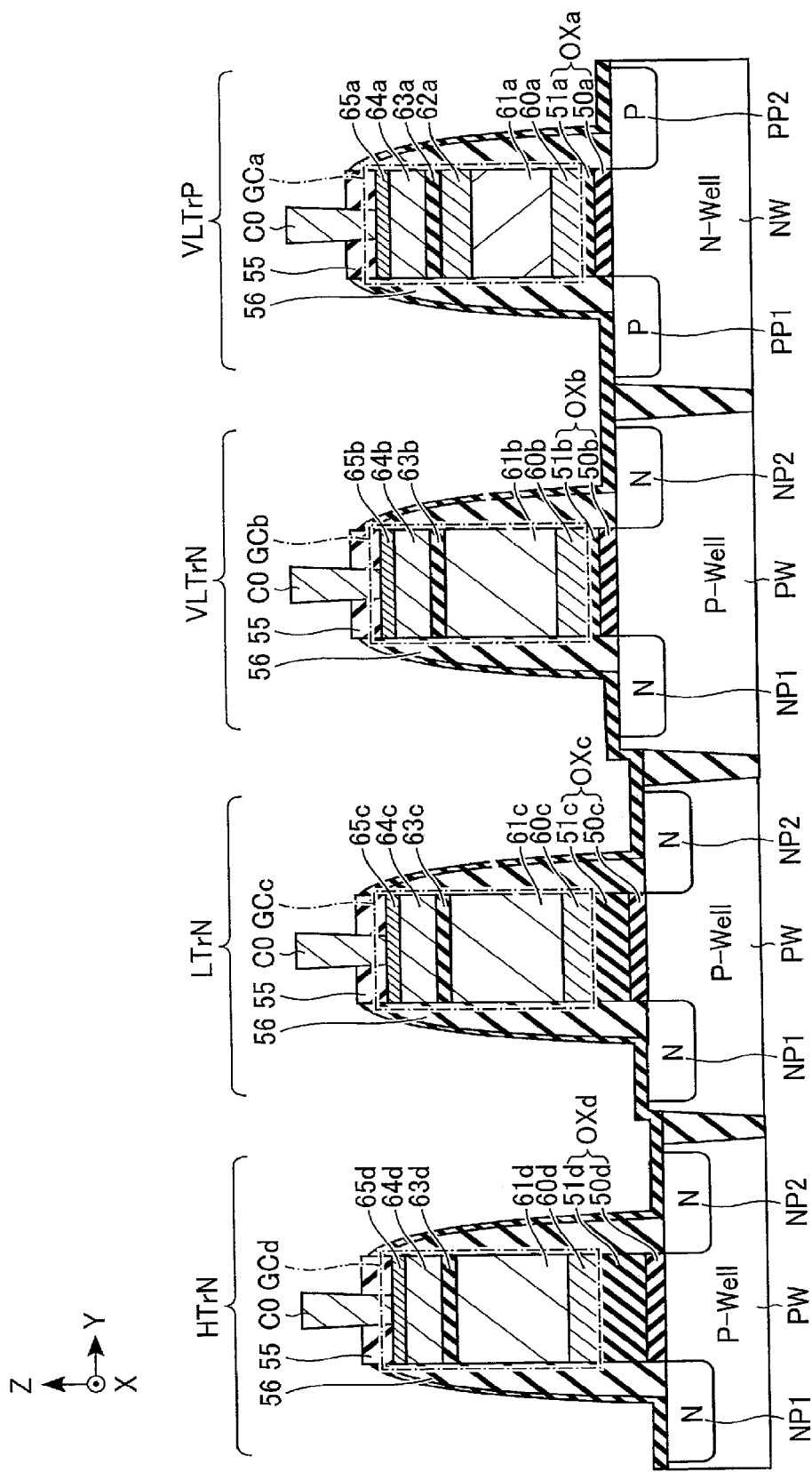
F I G. 27

SEMICONDUCTOR MEMORY DEVICE AND METHOD OF MANUFACTURING SEMICONDUCTOR MEMORY DEVICE

CROSS-REFERENCE TO RELATED APPLICATIONS

This application is based upon and claims the benefit of priority from Japanese Patent Application No. 2020-049442, filed Mar. 19, 2020, the entire contents of which are incorporated herein by reference.

FIELD

Embodiments described herein relate generally to a semiconductor memory device and a method of manufacturing the semiconductor memory device.

BACKGROUND

A NAND-type flash memory capable of storing data in a non-volatile manner is known.

BRIEF DESCRIPTION OF THE DRAWINGS

FIG. 2 is a circuit diagram showing an example of a circuit configuration of a memory cell array included in the semiconductor memory device according to the first embodiment.

FIG. 5 is a cross-sectional view, taken along line IV-IV of FIG. 3, showing an example of a cross-sectional structure of a control transistor included in the semiconductor memory device according to the first embodiment.

FIG. 10 is a flowchart showing an example of a method of manufacturing the semiconductor memory device according to the first embodiment.

FIGS. 11 to 18 are cross-sectional diagrams showing examples of cross-sectional structures of the semiconductor memory device in the course of manufacturing according to the first embodiment.

FIGS. 22 to 26 are cross-sectional diagrams showing examples of cross-sectional structures of the semiconductor memory device in the course of manufacturing according to the second embodiment.

FIG. 27 is a cross-sectional view showing an example of a cross-sectional structure of a control transistor included in the semiconductor memory device according to a third embodiment.

DETAILED DESCRIPTION

In general, according to one embodiment, a semiconductor memory device includes a memory cell, a P-type transistor, and a first N-type transistor. The P-type transistor and the first N-type transistor is provided on a top surface of a substrate and electrically coupled to the memory cell. The P-type transistor includes a first gate insulating layer provided on the substrate, a first source region provided in the substrate, a first drain region provided in the substrate, and a first gate electrode provided on the first gate insulating layer. The first gate electrode includes a first semiconductor layer containing carbon, a P-type second semiconductor layer provided on the first semiconductor layer, a third semiconductor layer provided on the second semiconductor layer, and a first conductive layer provided above the third semiconductor layer. The first N-type transistor includes a second gate insulating layer provided on the substrate, a second source region provided in the substrate, a second drain region provided in the substrate, and a second gate electrode provided on the second gate insulating layer. The second gate electrode includes a fourth semiconductor layer containing carbon, an N-type fifth semiconductor layer provided on the fourth semiconductor layer, a sixth semiconductor layer provided on the fifth semiconductor layer and containing carbon, and a second conductive layer provided above the sixth semiconductor layer.

Hereinafter, the embodiments will be described with reference to the accompanying drawings. Each embodiment exemplifies a device and a method for embodying the technical idea of the embodiment. It should be noted that the drawings are schematic or conceptual, and that the dimensions and scales of the drawings are not necessarily the same as those of the actual products. The entire description of an embodiment is applicable to another embodiment, unless otherwise expressly or implicitly excluded. The technical idea of the present embodiments is not specified by the shapes, configurations, arrangements, etc. of the structural components.

In the following description, structural elements having substantially the same function and configuration will be denoted by the same reference symbol. A numeral following letters constituting a reference symbol is used to distinguish between components referred to by reference symbols including the same letters and having the same configuration. If components represented by reference symbols including the same letters need not be distinguished, such components are assigned reference symbols including only the same letters.

[1] First Embodiment

[1-1] Configuration (Structure)

Hereinafter, a semiconductor memory device 1 according to the embodiment will be described.

[1-1-1] Configuration of Semiconductor Memory Device 1

Figure 1:
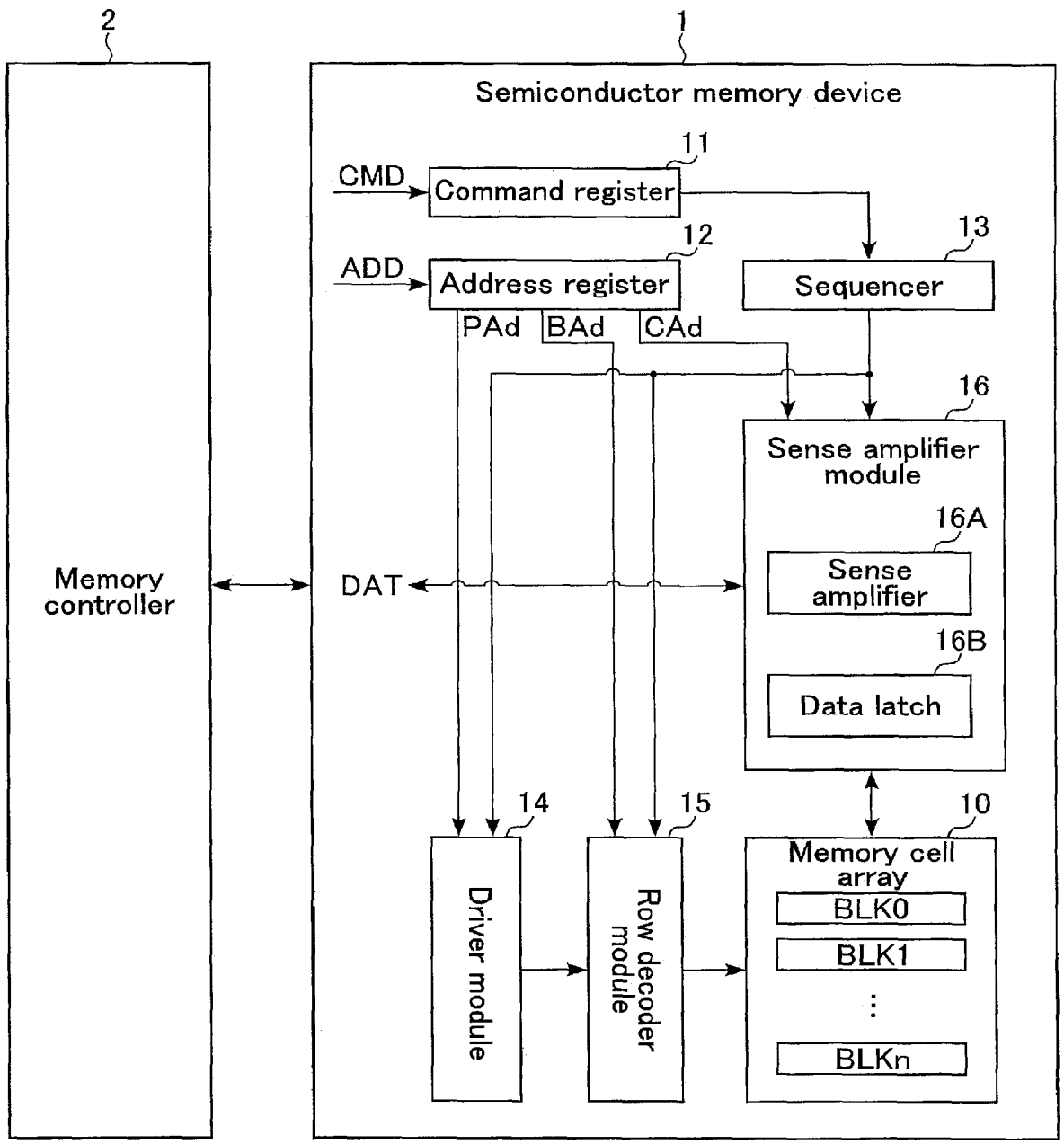
FIG. 1 is a block diagram showing a configuration example of a semiconductor memory device according to a first embodiment.

FIG. 1 shows a configuration example of the semiconductor memory device 1 according to the first embodiment.

The semiconductor memory device 1 is, for example, a NAND flash memory, which is capable of storing data in a non-volatile manner. The semiconductor memory device 1 is controlled by an external memory controller 2.

As shown in FIG. 1, the semiconductor memory device 1 includes, for example, a memory cell array 10, a command register 11, an address register 12, a sequencer 13, a driver module 14, a row decoder module 15, and a sense amplifier module 16.

The memory cell array 10 includes a plurality of blocks BLK0 to BLKn (where n is an integer not less than 1). Each block BLK includes a set of memory cell transistors MT (not illustrated) capable of storing data in a non-volatile manner, and is used as, for example, a unit of data erasure. A source line SL, word lines WL, and bit lines BL (not illustrated) are coupled to the memory cell array 10. Each memory cell transistor is associated with, for example, a single bit line BL and a single word line WL. A detailed configuration of the memory cell array 10 will be described later.

The command register 11 retains a command CMD that is received by the semiconductor memory device 1 from the memory controller 2. The command CMD includes, for example, commands to cause the sequencer 13 to execute a read operation, a write operation, and an erase operation.

The address register 12 retains address information ADD received by the semiconductor memory device 1 from the memory controller 2. The address information ADD includes, for example, a block address BAd, a page address PAd, and a column address CAd. For example, the block address BAd, the page address PAd, and the column address CAd are used to select a block BLK, a word line WL, and a bit line BL, respectively.

The sequencer 13 controls the entire operation of the semiconductor memory device 1. For example, the sequencer 13 controls the driver module 14, the row decoder module 15, and the sense amplifier module 16, etc., based on the command CMD retained in the command register 11, to perform a read operation, a write operation, an erase operation, etc.

The driver module 14 generates a voltage to be used in a read operation, a write operation, an erase operation, etc., and supplies the generated voltage to the row decoder module 15. Based on, for example, the page address PAd retained in the address register 12, the driver module 14 applies the generated voltage to a signal line corresponding to a selected word line WL.

The row decoder module 15 selects one block BLK in the corresponding memory cell array 10, based on the block address BAd retained in the address register 12. The row decoder module 15 transfers, for example, the voltage applied to the signal line corresponding to the selected word line WL, to the selected word line WL in the selected block BLK.

The sense amplifier module 16 includes a sense amplifier 16A and a data latch 16B. The sense amplifier 16A senses the state of the memory cell transistors MT, generates read data DAT based on the sensed state, and transfers write data DAT to the memory cell transistors MT. Furthermore, the sense amplifier 16A applies, to each bit line BL, a voltage determined in accordance with the write data DAT received from the memory controller 2. The data latch 16B retains the write data DAT received from the memory controller 2 and supplies the write data DAT to the sense amplifier 16A. The data latch 16B receives the read data DAT from the sense amplifier 16A, and supplies the read data DAT to the memory controller 2.

The semiconductor memory device 1 and the memory controller 2 as described above may be combined to constitute one semiconductor device. Examples of such a semiconductor device include a memory card such as an SD™ card, a solid state drive (SSD), etc.

[1-1-2] Circuit Configuration of Memory Cell Array 10

FIG. 2 shows an example of the circuit configuration of the memory cell array 10 in the semiconductor memory device 1 according to the first embodiment, by extracting one block BLK out of the plurality of blocks BLK included in the memory cell array 10. All the other blocks BLK are also configured of the same components and connections as those shown in FIG. 2. The number of blocks BLK in the memory cell array 10 and the number of string units SU in one block BLK may be set to any number. In the description given below, let us assume, as an example, that a block BLK includes four string units SU0 to SU3.

Each string unit SU is a set of NAND strings NS that are respectively associated with bit lines BL0 to BLm (where m is an integer not less than 1). Each NAND string NS includes, for example, memory cell transistors MT0 to MT7 and select transistors ST1 and ST2. Each memory cell transistor MT includes a control gate and a charge storage layer, and stores data in a non-volatile manner. Each of select transistors ST1 and ST2 is used to select a string unit SU at the time of performing various operations.

In each NAND string NS, memory cell transistors MT0 to MT7 are coupled in series. A drain of the select transistor ST1 is coupled to a corresponding bit line BL, and a source of the select transistor ST1 is coupled to one end of a set of memory cell transistors MT0 to MT7 coupled in series. A drain of the select transistor ST2 is coupled to the other end of the set of memory cell transistors MT0 to MT7 coupled in series. The source of the select transistor ST2 is coupled to the source line SL.

In the same block BLK, the control gates of the memory cell transistors MT0 to MT7 are respectively coupled in common to word lines WL0 to WL7. Gates of the select transistors ST1 in the string units SU0 to SU3 are respectively coupled in common to the select gate lines SGD0 to SGD3. Gates of the select transistors ST2 are coupled in common to the select gate line SGS.

One of the NAND strings NS in each string unit SU is coupled to a corresponding bit line BL. The source line SL is shared by, for example, a plurality of blocks BLK.

A set of memory cell transistors MT coupled to a common word line WL in a single string unit SU is referred to as, for example, a cell unit CU. For example, the storage capacity of the cell unit CU including memory cell transistors MT, which individually store 1-bit data, is defined as "1-page data". The cell unit CU may have a storage capacity of 2 or more pages of data, according to the number of bits of data stored in the memory cell transistor MT.

The circuit configuration of the memory cell array 10 included in the semiconductor memory device 1 according to the first embodiment is not limited to the configuration described above. For example, each of the numbers of the memory cell transistors MT and the select transistors ST1 and ST2 that are included in each NAND string NS may be determined as appropriate.

[1-1-3] Planar Structure of Memory Cell Array 10

Hereinafter, an example of a structure of the memory cell array 10 according to the embodiment will be described.

In the drawings that will be referred to hereinafter, "Y direction" corresponds to the direction in which the bit lines BL extend, "X direction" corresponds to the direction in which the word lines WL extend, and "Z direction" corresponds to the direction vertical to the surface of the semiconductor substrate 20 (not illustrated), on which the semiconductor memory device 1 is formed. In the planar views, hatching is applied, where necessary, for improved visibility. The hatching applied in the planar views does not necessarily relate to the material or characteristics of the hatched components. In the cross-sectional views, structural elements such as insulating layers (interlayer insulating films), interconnects, contacts, and the like are omitted as appropriate, for improved visibility.

Figure 3:
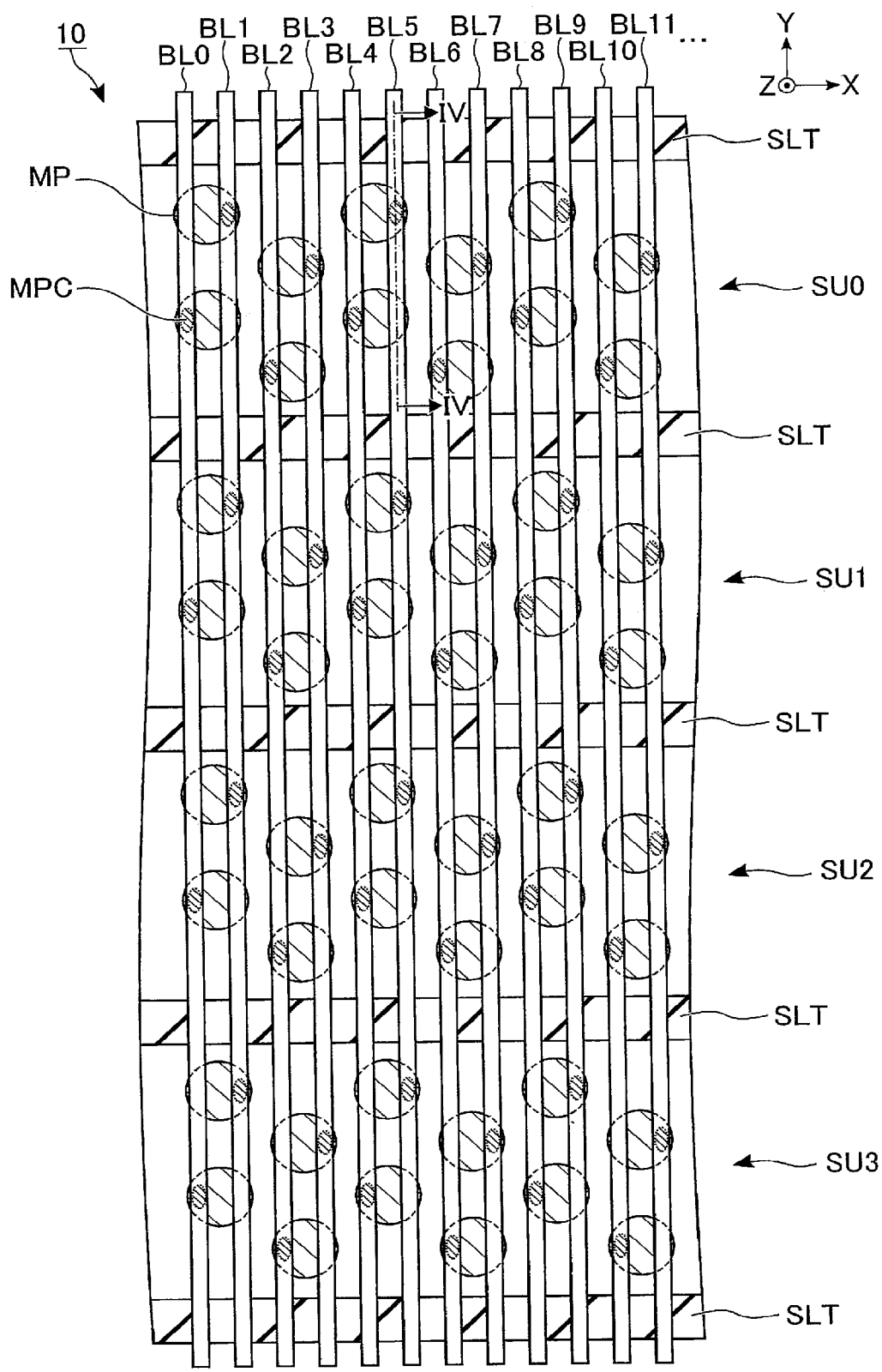
FIG. 3 is a plan view showing an example of a planar layout of the memory cell array included in the semiconductor memory device according to the first embodiment.

FIG. 3 shows an example of a planar layout of the memory cell array 10 included in the semiconductor memory device 1 according to the first embodiment, by extracting a region including structures corresponding to the string units SU0 to SU3. As shown in FIG. 3, the memory cell array 10 includes, for example, slits SLT, memory pillars MP, contacts MPC, and bit lines BL.

The slits SLT extend in the X direction, and are arranged in the Y direction. The slits SLT include an insulator. The slits SLT divide, for example, the interconnect layers functioning as the word lines WL, the interconnect layers functioning as the select gate lines SGD, and the interconnect layers functioning as the select gate line SGS, respectively.

The region separated by the slits SLT corresponds to one string unit SU. Specifically, the slits SLT are respectively interposed between the string units SU0 and SUL between the string units SU1 and SU2, and between the string units SU2 and SU3, which are adjacent to each other in the Y direction. A pattern laid out, for example as shown in FIG. 3, is repeated in the Y direction in the memory cell array 10.

The memory pillars MP are arranged in a staggered manner in, for example, four rows in the region functioning as the string unit SU or the like. The number and arrangement of the memory pillars MP between the adjacent slits SLT are not limited to this example, but may be suitably varied. Each memory pillar MP functions as, for example, one NAND string NS.

The bit lines BL extend in the Y direction, and are arranged in the X direction. Each bit line BL is disposed to overlap at least one memory pillar MP in each string unit SU. For example, two bit lines BL overlap each memory pillar MP. A contact MPC is provided between a memory pillar MP and one of the bit lines BL overlapping the memory pillar MP. Each memory pillar MP is electrically coupled to the corresponding one bit line BL via the contact MPC. One contact MPC is coupled to one bit line BL in each of the regions that are partitioned by the slits SLT. The number of bit lines BL overlapping each memory pillar MP may be designed to be any number.

[1-1-4] Cross-sectional Structure of Memory Cell Array 10

Figure 4:
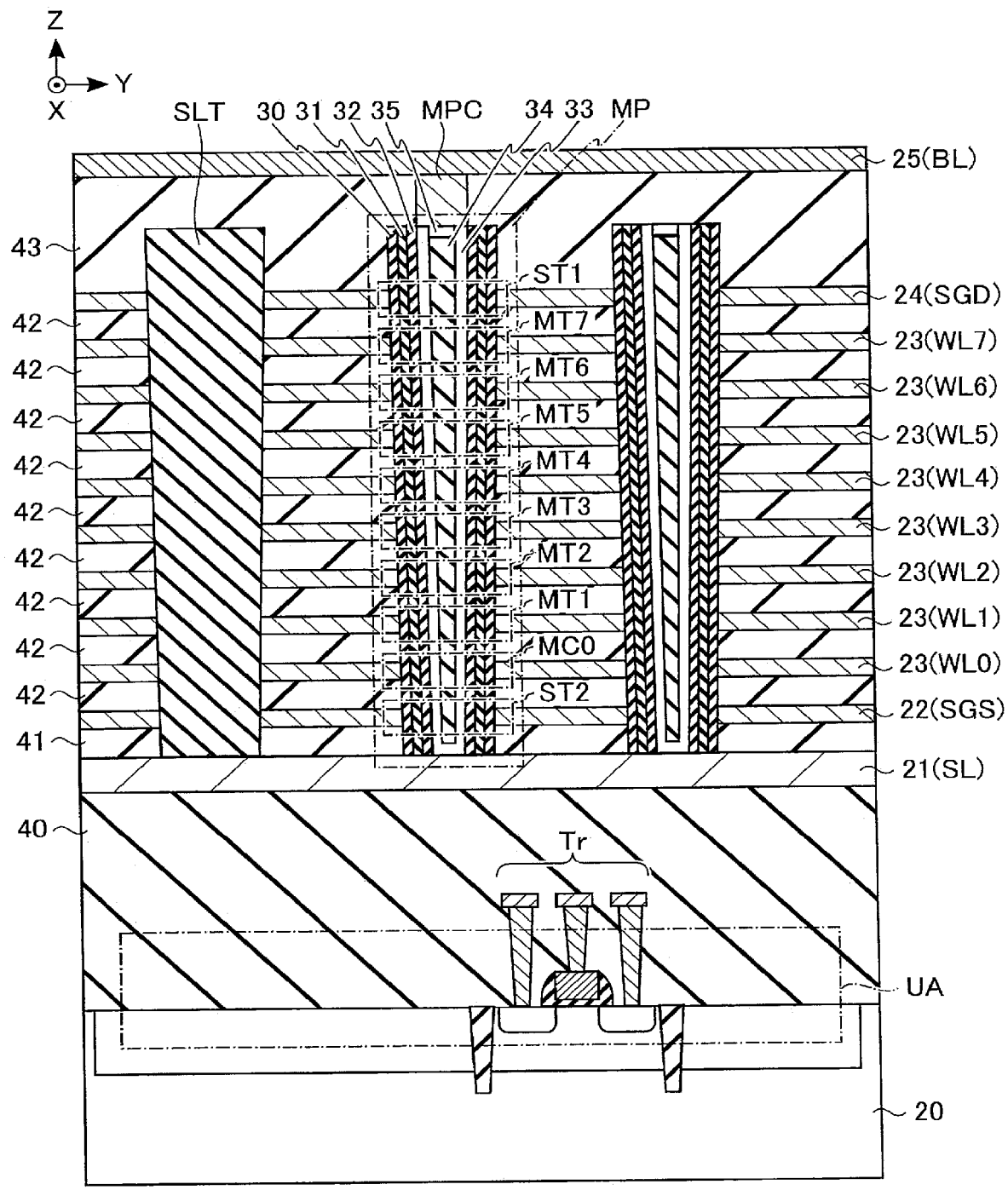
FIG. 4 is a cross-sectional view, taken along line IV-IV of FIG. 3, showing an example of a cross-sectional structure of the memory cell array included in the semiconductor memory device according to the first embodiment.

FIG. 4 is a cross-sectional view taken along line IV-IV in FIG. 3, which shows an example of the cross-section structure of the memory cell array 10 and the control transistor included in the semiconductor memory device 1 according to the first embodiment. As shown in FIG. 4, the semiconductor memory device 1 includes, for example, conductor layers 21 to 24, a memory pillar MP, a contact MPC, a slit SLT, and a circuit region UA. Next, a cross-sectional structure of the semiconductor memory device 1 will be described below.

An insulating layer 40 is provided above the semiconductor substrate 20. The insulating layer 40 contains, for example, silicon oxide (SiO2). The circuit region UA is provided in a part of the semiconductor substrate 20 and in the insulating layer 40, and the memory cell array 10 is provided above the insulating layer 40. In the circuit region UA, a circuit used, for example, in the sense amplifier module 16 is formed, and the circuit includes a control transistor etc. The control transistor controls, for example, the memory cell array 10 provided above.

A configuration of the memory cell array 10 will be explained first. The conductive layer 21 is provided above the insulating layer 40. The conductive layer 21 is formed in a plate shape expanding along, for example, the xy plane, and is used as a source line SL. The conductor layer 21 contains, for example, silicon (Si), or metal materials.

A conductive layer 22 is provided above the conductive layer 21 with an insulating layer 41 interposed therebetween. The insulating layer 41 and the conductive layer 22 are formed into a plate shape expanding, for example, along the xy plane, and used as a select gate line SGS. The insulating layer 41 contains, for example, silicon oxide. The conductor layer 22 contains, for example, tungsten (W).

The insulating layers 42 and the conductive layers 23 are alternately stacked above the conductive layer 22. The insulating layer 42 and the conductive layer 23 are formed into a plate shape expanding, for example, along the xy plane. For example, the plurality of stacked conductive layers 23 are used respectively in sequence as word lines WL0 to WL7, from the semiconductor substrate 20 side. The insulating layer 42 contains, for example, silicon oxide. The conductor layers 23 contains, for example, tungsten (W).

A conductive layer 24 is provided above the topmost conductor layer 42. The conductive layer 24 is formed into a plate shape expanding, for example, along the xy plane, and is used as a select gate line SGD. The conductive layer 24 includes, for example, tungsten (W).

A conductive layer 25 is provided above the conductive layer 24 with the insulating layer 43 interposed therebetween. The conductive layer 25 is formed into, for example, a linear shape extending, for example, in the y direction, and is used as a bit line BL. A plurality of conductive layers 25 are arranged along the x direction in an unillustrated region. The insulating layer 43 contains, for example, silicon oxide. The conductive layer 25 contains, for example, copper (Cu).

The memory pillars MP extend in the Z direction, penetrating the insulating layers 41 and 42, and the conductive layers 22 to 24. An upper-most end of the memory pillar MP is included in the insulating layer 43. A lowermost end of the memory pillar MP is in contact with the conductive layer 21.

Each of the memory pillars MP includes, for example, a block insulating film 30, an insulating film 31, a tunnel insulating film 32, semiconductor layers 33 and 35, and a core member 34.

Specifically, the core member 34 extends in the z direction, and is provided in a central portion of the memory pillar MP. An upper end of the core member 34 is included in, for example, a layer above the layer in which the uppermost conductive layer 24 is provided, and a lower end of the core member 34 is included in, for example, a layer below the layer in which the conductive layer 22 is provided. The core member 34 contains an insulator such as silicon oxide.

The semiconductor layer 33 covers the side surface and the bottom surface of the core member 34. The bottom surface of the semiconductor layer 33 is, for example, in contact with the conductive layer 21. The semiconductor layer 33 contains, for example, polysilicon.

The tunnel insulating film 32 covers the side surface of the semiconductor layer 33. The tunnel insulating film 32 contains, for example, silicon oxide. The insulating film 31 covers the side surface of the tunnel insulating film 32. The insulating film 31 contains, for example, silicon nitride (SiN). The block insulating film 30 covers the side surface of the insulating film 31. The block insulating film 30 contains, for example, silicon oxide.

A semiconductor layer 35 is included in a layer above the conductive layer 24, and that is in contact with an inner wall of the semiconductor layer 33 at a side surface, and in contact with an upper surface of the core member 34 at a bottom surface, for example. The semiconductor layer 35 and the semiconductor layer 33 are electrically coupled. The semiconductor portion 35 contains, for example, the same material as the semiconductor layer 33.

The contact MPC, which is pillar-shaped, is provided on the top surfaces of the semiconductor layers 33 and 35 in the memory pillar MP. In the illustrated region, the contact MPC coupled to one of the two memory pillars MP is shown. A contact MPC is coupled to another memory pillar MP, which is not coupled to the contact MPC in this region, in a region not shown in the figure. The top surface of the contact MPC is in contact with one conductor layer 25, i.e., one bit line BL.

The slit SLT is formed into, for example, a plate-like shape expanding along the xz plane, and divides the insulating layers 41 and 42 and the conductive layers 22 to 24. The top end of the slit SLT is included in the insulating layer 43. The bottom end of the slit SLT is in contact with the conductive layer 21. The slit SLT contains an insulator such as silicon oxide.

In the structure of the memory pillar MP explained above, a portion at which the memory pillar MP and the conductive layer 22 intersect functions as the select transistor ST2. A portion at which the memory pillar MP and the conductive layer 23 intersect functions as the memory cell transistor MT. A portion at which the memory pillar MP and the conductive layer 24 intersect functions as the select transistor ST1.

Namely, the semiconductor layer 33 is used as the channel of each of the memory cell transistors MT, and select transistors ST1 and ST2. The insulating film 31 is used as the charge storage layer of the memory cell transistor MT. Accordingly, each memory pillar MP functions as one NAND string NS.

The circuit region UA includes a plurality of transistors Tr. FIG. 4 shows only one transistor Tr. The transistor Tr in the circuit region UA is used in, for example, the driver module 14, the row decoder module 15, the sense amplifier module 16, etc. Details of the circuit region UA will be described later with reference to FIG. 5.

[1-1-5] Cross-sectional Structure of Circuit Region UA

Figure 6:
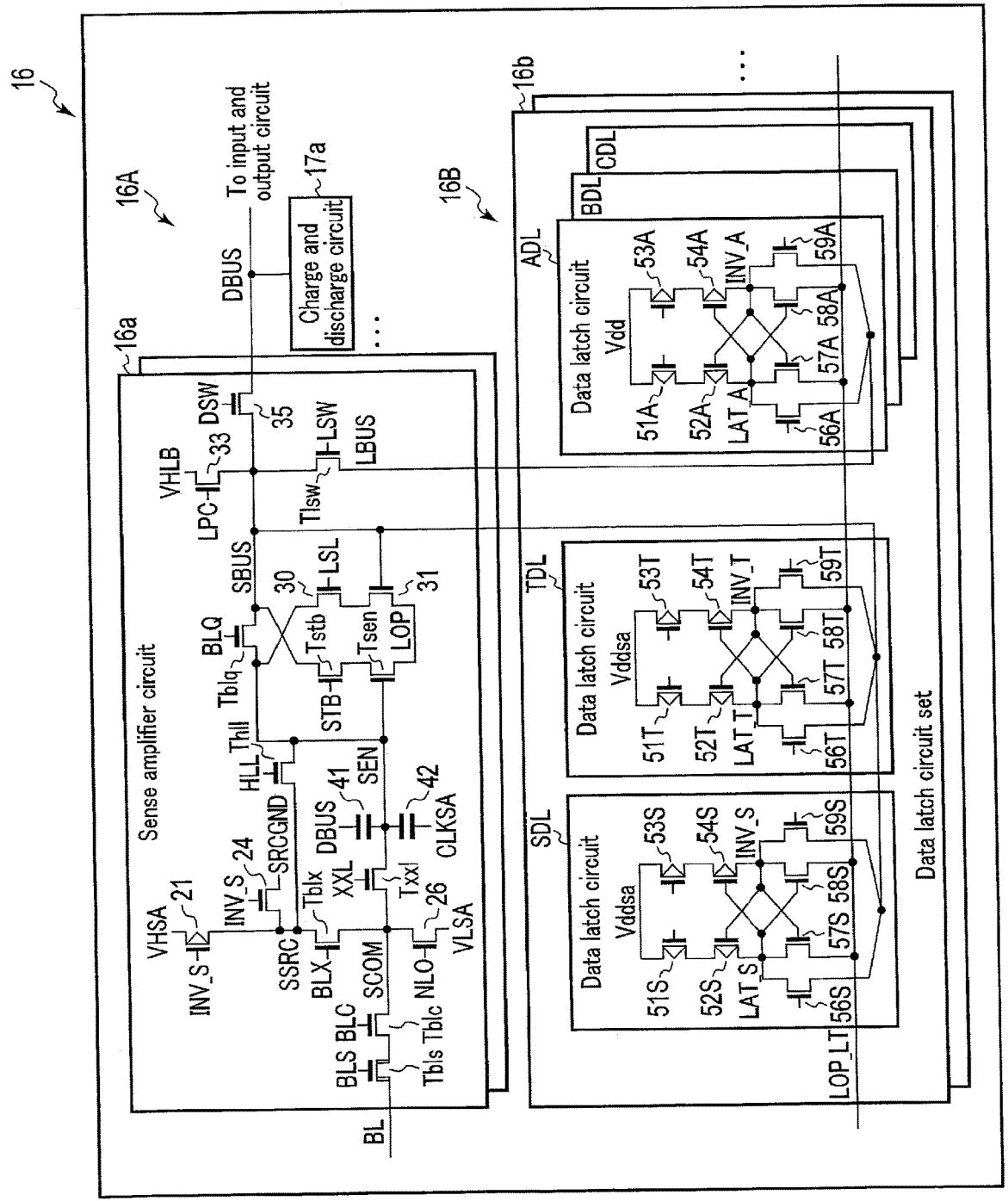
FIG. 6 is a circuit diagram showing components and connections of a part of a sense amplifier module of the semiconductor memory device according to the first embodiment.

FIG. 5 shows a part of a cross section taken along line IV-IV in FIG. 3, schematically showing an example of cross-sectional structures of the control transistors in the semiconductor memory device 1 according to the first embodiment. More specific configurations and characteristics of the cross-sectional structures shown in FIG. 5 will be described later in detail. In the explanation of FIG. 5 below, FIG. 6 will be referred to when necessary. FIG. 6 shows parts of the components and connections of the sense amplifier module 16. With regard to FIG. 6, only portions related to FIG. 5 are described.

First, as shown in FIG. 6, the sense amplifier module 16 includes a sense amplifier 16A and a data latch 16B. The sense amplifier 16A includes a plurality of sense amplifier circuits 16a. All of the sense amplifier circuits 16a have the same components and connections. One sense amplifier circuit 16a is coupled to one bit line BL.

The data latch 16B includes a plurality of data latch circuit sets 16b. One data latch circuit set 16b includes data latch circuits SDL, TDL, ADL, BDL, and CDL, and is coupled to one sense amplifier circuit 16a. All of the data latch circuit sets 16b have the same components and connections. One data latch circuit set 16b may include a further data latch circuit.

As shown in FIG. 5, the circuit region UA includes, for example, control transistors HTrN, LTrN, VLTrN, and VLTrP. For ease of reference in FIG. 5, the control transistors HTrN, LTrN, VLTrN, and VLTrP are drawn to be in the vicinity of each other. In reality, however, the control transistors HTrN and LTrN are separated, and the control transistors LTrN and VLTrN are separated, and another transistor may be interposed between the separate transistors.

The control transistor HTrN is an N-channel MOSFET. The control transistor HTrN is designed to handle a high voltage, and has a high breakdown voltage. Hereinafter, the control transistor HTrN may be represented as the high breakdown voltage transistor HTrN. The control transistor HTrN is used in a circuit that requires a high breakdown voltage, for example, a high voltage transferring switch in the row decoder module 15 and a protective transistor Tbls in the sense amplifier module 16. The transistor Tbls is included in the sense amplifier circuit 16a, as shown in FIG. 6. The transistor Tbls is coupled to the bit line BL in series.

The driving voltage of the control transistor HTrN is, for example, 20 V or higher.

As shown in FIG. 5, the control transistor LTrN is an N-channel MOSFET. The control transistor LTrN is designed to handle a voltage lower than the voltage handled by the control transistor HTrN, and has a breakdown voltage lower than that of the control transistor HTrN. Hereinafter, the control transistor LTrN may be represented as the low breakdown voltage transistor LTrN. The control transistor LTrN is used in a circuit that performs an analog operation, such as a transistor Tblc in the sense amplifier module 16. It is also used in a circuit that requires a lower voltage and/or a higher-speed operation than is required for the high breakdown voltage transistor HTrN. The transistor Tblc is included in the sense amplifier circuit 16a, and coupled to the transistor Tbls at one end in series, as shown in FIG. 6. The transistor Tblc is coupled, at the other end, to a node SEN via a transistor Txxl. The node SEN has a voltage based on a state of the memory cell transistor MT that is a target of reading in the sense amplifier circuit 16a.

The driving voltage of the control transistor LTrN is, for example, about 2.5 to 4.5 V.

The control transistor VLTrP and the control transistor VLTrN are respectively a P-channel MOSFET and an N-channel MOSFET. The control transistors VLTrP and VLTrN are designed to handle a voltage lower than the voltage handled by the control transistor LTrN, and have a breakdown voltage lower than that of the control transistor LTrN. Hereinafter, the control transistors VLTrP and VLTrN may be represented as the very-low breakdown voltage transistors VLTrP and VLTrN. The very-low breakdown voltage transistors VLTrP and VLTrN are used in a logic circuit or a circuit that performs a digital operation, such as the data latch 16B in the sense amplifier module 16. They are also used in a circuit that requires a lower voltage and/or a higher-speed operation than is required for the low breakdown voltage transistor LTrN. The part of the data latch 16B in which the very-low breakdown voltage transistors VLTrP and VLTrN are used will be specifically described with reference to FIG. 6. For example, each of the data latch circuits SDL, TDL, ADL, BDL, and CDL includes transistors 52, 54, 57, and 58. The set of the transistors 52, 54, 57, and 58 has a structure in which two inverter circuits are cross-coupled. The very-low breakdown voltage transistors VLTrP and VLTrN are used in the cross-coupled portion. The very-low breakdown voltage transistor VLTrP is used in, for example, the transistors 52, 54, etc. The very-low breakdown voltage transistor VLTrN is used in, for example, the transistors 57, 58, etc.

The driving voltage of the control transistors VLTrP and VLTrN is, for example, about 1.2 to 1.8 V.

As shown in FIG. 5, for example, a P-type well region PW, an N-type well region NW, and an element isolation region STI are provided in a top surface (near surface) region of the semiconductor substrate 20.

The P-type well region PW, N-type well region NW, and element isolation region STI are each in contact with the top surface of the semiconductor substrate 20. The element isolation region STI is provided to electrically isolate, for example, the N-type well region NW and the P-type well region PW. For example, silicon oxide is used for the element isolation region STI.

The very-low breakdown voltage transistor VLTrP is provided in the N-type well region NW. The very-low breakdown voltage transistor VLTrN, the low breakdown voltage LTrN, and the high breakdown voltage transistor HTrN are provided in the P-type well region PW.

The very-low breakdown voltage transistor VLTrP includes p-type impurity diffusion regions PP1 and PP2, an insulating layer OXa, a gate electrode GCa, and an insulating layer SW.

The p-type impurity diffusion regions PP1 and PP2 are formed in a top surface (near surface) region of the N-type well region NW, and doped with, for example, boron (B). The p-type impurity diffusion regions PP1 and PP2 are separated in the Y direction. The p-type impurity diffusion regions PP1 and PP2 function as a source (source diffusion layer) and a drain (drain diffusion layer) of the very-low breakdown voltage transistor VLTrP. The concentration of boron doped into the p-type impurity diffusion regions PP1 and PP2 need not be uniform over the entire region of each of the p-type impurity diffusion regions PP1 and PP2. For example, the boron concentration of the p-type impurity diffusion region PP1 may be lower in a region nearer to the p-type impurity diffusion region PP2 and higher in a farther region. The boron concentration of the p-type impurity diffusion region PP2 may be lower in a region nearer to the p-type impurity diffusion region PP1 and higher in a farther region.

The insulating layer OXa is provided above the N-type well region NW between the p-type impurity diffusion regions PP1 and PP2, and functions as a gate insulating film of the very-low breakdown voltage transistor VLTrP. The insulating layer OXa is formed of an insulating material which includes a stacked structure of, for example, silicon oxide and silicon nitride.

The gate electrode GCa is provided on the insulating layer OXa.

The insulating layer SW is provided on a side surface of the gate electrode GCa of the very-low breakdown voltage transistor VLTrP, and functions as a side wall.

The very-low breakdown voltage transistor VLTrN includes n-type impurity diffusion regions NP1 and NP2, an insulating layer OXb, a gate electrode GCb, and an insulating layer SW.

The n-type impurity diffusion regions NP1 and NP2 are formed in a top surface (near surface) region of the P-type well region PW, and doped with, for example, phosphorus (P). The n-type impurity diffusion regions NP1 and NP2 are separated in the Y direction. The n-type impurity diffusion regions NP1 and NP2 function as a source (source diffusion layer) and a drain (drain diffusion layer) of the very-low breakdown voltage transistor VLTrN.

The insulating layer OXb is provided above the P-type well region PW between the n-type impurity diffusion regions NP1 and NP2, and functions as a gate insulating film of the very-low breakdown voltage transistor VLTrN. The insulating layer OXb is formed of an insulating material which includes a stacked structure of, for example, silicon oxide and silicon nitride.

The gate electrode GCb is provided on the insulating layer OXb.

The insulating layer SW is provided on a side surface of the gate electrode GCb of the very-low breakdown voltage transistor VLTrN, and functions as a side wall.

The low breakdown voltage transistor LTrN includes n-type impurity diffusion regions NP1 and NP2, an insulating layer OXc, a gate electrode GCc, and an insulating layer SW. The low breakdown voltage transistor LTrN is the same as the very-low breakdown voltage transistor VLTrN except for the insulating layer OXc and the gate electrode GCc.

The insulating layer OXc is provided above the P-type well region PW between the n-type impurity diffusion regions NP1 and NP2, and functions as a gate insulating film of the low breakdown voltage transistor LTrN. The insulating layer OXc is formed of an insulating material which includes a stacked structure of, for example, silicon oxide and silicon nitride.

The gate electrode GCc is provided on the insulating layer OXc.

The high breakdown voltage transistor HTrN includes n-type impurity diffusion regions NP1 and NP2, an insulating layer OXd, a gate electrode GCd, and an insulating layer SW. The high breakdown voltage transistor HTrN is the same as the very-low breakdown voltage transistor VLTrN except for the insulating layer OXd and the gate electrode GCd.

The insulating layer OXd is provided above the P-type well region PW between the n-type impurity diffusion regions NP1 and NP2, and functions as a gate insulating film of the high breakdown voltage transistor HTrN. The insulating layer OXd is formed of an insulating material which includes a stacked structure of, for example, silicon oxide and silicon nitride.

The gate electrode GCd is provided on the insulating layer OXd.

The circuit region UA includes, for example, contact plugs CS and C0, and a conductive layer D0. The conductive layer D0 functions as interconnects provided above the control transistors HTrN, LTrN, VLTrN, and VLTrP.

The contact plug CS is a conductive layer provided between the conductive layer D0 and the source or drain of each of the control transistors HTrN, LTrN, VLTrN, and VLTrP. The contact plug C0 is a conductive layer provided between the conductive layer D0 and the gate electrode of each of the control transistors HTrN, LTrN, VLTrN, and VLTrP. The p-type impurity diffusion regions PP1 and PP2 and n-type impurity diffusion regions NP1 and NP2 are electrically coupled to different conductive layers D0 via the respective contact plugs CS. The gate electrodes GCa, GCb, GCc, and GCd are electrically coupled to different conductive layers D0 via the respective contact plugs C0.

[1-1-6] Structure of Control Transistor

Details of the structures of the control transistors HTrN, LTrN, VLTrN, and VLTrP will be described with reference to FIGS. 7 to 9. Depiction of the insulating layer 40 is omitted from FIGS. 7 to 9. The region in which the very-low breakdown voltage transistor VLTrP is formed, the region in which the very-low breakdown voltage transistor VLTrN is formed, the region in which the low breakdown voltage transistor LTrN is formed, and the region in which the high breakdown voltage transistor HTrN is formed may be respectively represented as a VLTrP forming region, a VLTrN forming region, an LTrN forming region, and an HTrN forming region.

Figure 7:
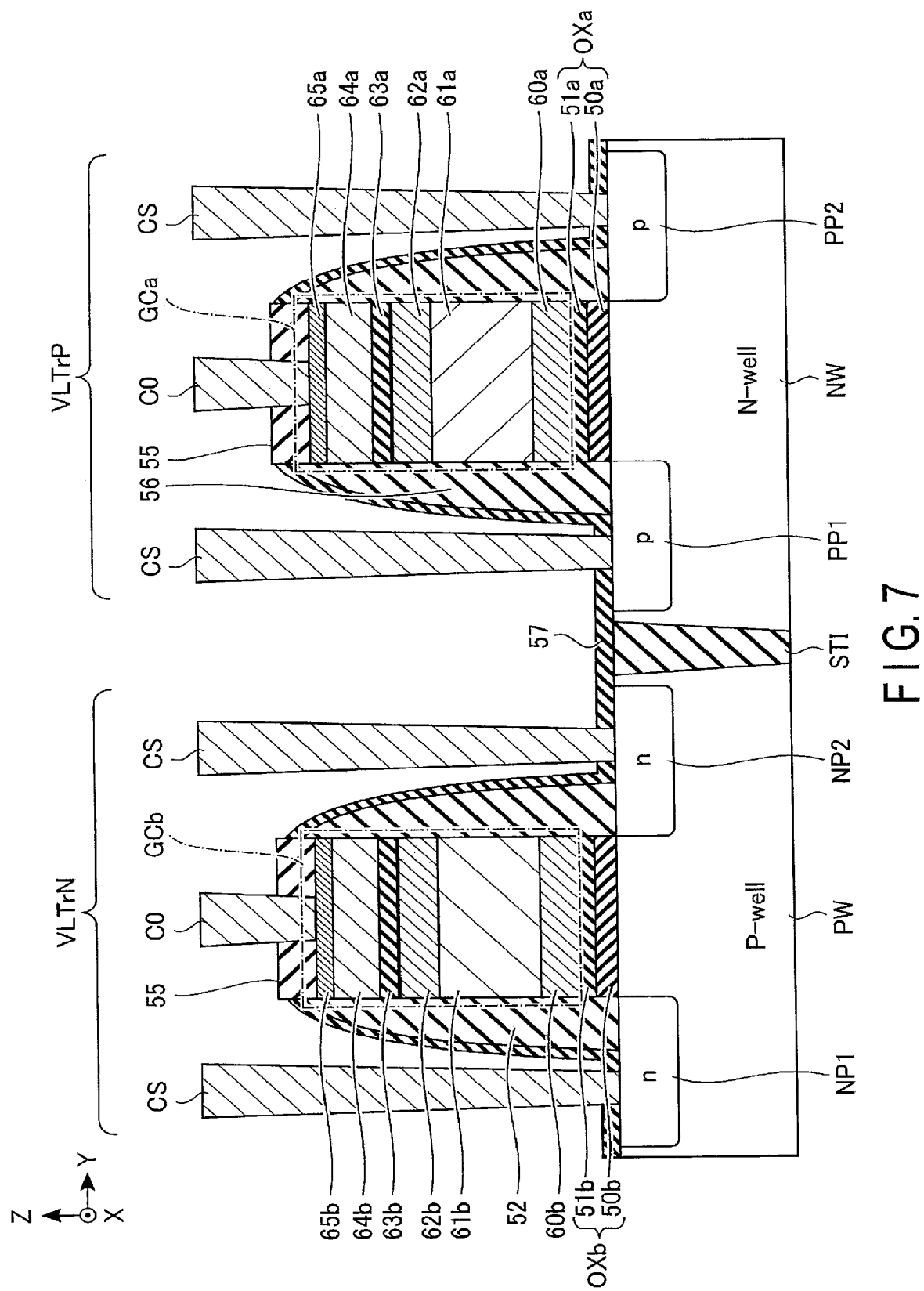
FIGS. 7 to 9 are cross-sectional views showing examples of cross-sectional structures of the control transistor included in the semiconductor memory device according to the first embodiment.

FIG. 7 illustrates an example of details of a cross-sectional structure of the control transistors VLTrN and VLTrP in the semiconductor memory device 1 according to the first embodiment.

First, an example of a detailed structure of the very-low breakdown voltage transistor VLTrP will be described. The region of the very-low breakdown voltage transistor VLTrP includes the N-type well region NW, the p-type impurity diffusion regions PP1 and PP2, the gate electrode GCa, the contact plugs CS and C0, and the insulating layers OXa, 55, 56, and 57.

The insulating layer OXa includes the insulating layers 50a and 51a. The insulating layer 50a is provided above the N-type well region NW between the p-type impurity diffusion regions PP1 and PP2. The insulating layer 50a contains, for example, silicon oxynitride (SiON). The insulating layer 51a is provided above the insulating layer 50a. The insulating layer 51a contains, for example, silicon oxide. The insulating layer 50a is, for example, slightly thinner than about 3.5 nm.

The gate electrode GCa includes semiconductor layers 60a to 62a, an insulating layer 63a, a conductive layer 64a, and a conductive layer 65a. The semiconductor layer 60a is provided above the insulating layer 51a. The semiconductor layer 60a includes a polysilicon layer, for example, doped with carbon (C). The carbon concentration in the semiconductor layer 60a may not be uniform in the Z direction. The semiconductor layer 60a is utilized as a diffusion prevention layer that prevents boron (to be described later) contained in the semiconductor layer 61a from diffusing into the N-type well region NW through the insulating layer OXa. The semiconductor layer 61a may contain carbon due to diffusion of carbon contained in the semiconductor layer 60a into the semiconductor layer 61a. In this case, the carbon concentration in the semiconductor layer 61a is lower than that in the semiconductor layer 60a.

The semiconductor layer 61a is provided above the semiconductor layer 60a. The semiconductor layer 61a is a P-type semiconductor layer, and includes a polysilicon layer, for example, doped with boron (B).

The semiconductor layer 62a is provided above the semiconductor layer 61a. The semiconductor layer 62a includes a polysilicon layer, for example, doped with carbon (C). The carbon concentration in the semiconductor layer 62a may not be uniform in the Z direction. The semiconductor layer 62a is utilized as a diffusion prevention layer that prevents boron contained in the semiconductor layer 61a from diffusing into the conductive layer 64a through the insulating layer 63a. The semiconductor layer 61a may contain carbon due to diffusion of carbon contained in the semiconductor layer 62a into the semiconductor layer 61a. In this case, the carbon concentration in the semiconductor layer 61a is lower than that in the semiconductor layer 62a.

The insulating layer 63a is provided above the semiconductor layer 62a. The insulating layer 63a contains, for example, silicon oxide. The insulating layer 63a may be a natural oxide film. The insulating layer 63a has a film thickness in the Z direction that does not impair conductivity between the upper and lower films. The insulating layer 63a is utilized as a diffusion prevention layer that prevents boron contained in the semiconductor layer 61a from diffusing into the conductive layer 64a.

The conductive layer 64a is provided above the insulating layer 63a. The conductor layer 64a includes, for example, tungsten silicide (WSi). The insulating layer 63a and the conductive layer 64a may contain boron, for example, due to diffusion of boron from the semiconductor layer 61a.

The conductive layer 65a is provided above the conductive layer 64a. The conductive layer 65a contains, for example, titanium nitride (TiN). The conductive layer 65a is utilized as a diffusion prevention layer that prevents tungsten contained in the conductive layer 64a from diffusing into the insulating layer 55 and the contact plug C0.

The insulating layer 55 is provided above the conductive layer 65a. The insulating layer 55 contains, for example, silicon nitride. The insulating layer 55 functions as an etching stopper in processing of forming the contact plug C0.

The insulating layer 56 is provided on side surfaces of the insulating layer OXa, the gate electrode GCa, and the insulating layer 55, and the insulating layer 57 is provided on the insulating layer 56. The insulating layers 56 and 57 are used as a side wall of the gate electrode of a PMOS transistor TrP.

In the above-described structure relating to the very-low breakdown voltage transistor VLTrP, the contact plug C0 is formed in the contact hole that passes through the insulating layers 40 and 55, and the bottom of the contact plug C0 is in contact with the conductive layer 65a.

Next, with regard to an example of a detailed structure of the very-low breakdown voltage transistor VLTrN, a difference from the very-low breakdown voltage transistor VLTrP will be mainly described. As shown in FIG. 7, the region of the very-low breakdown voltage transistor VLTrN includes the P-type well region PW, the n-type impurity diffusion regions NP1 and NP2, the gate electrode GCb, the contact plugs CS and C0, and the insulating layers OXb, 55, 56, and 57.

The insulating layer 50b, the insulating layer 51b, the semiconductor layer 60b, the semiconductor layer 62b, the insulating layer 63b, the conductive layer 64b, and the conductive layer 65b are respectively the same as the insulating layer 50a, the insulating layer 51a, the semiconductor layer 60a, the semiconductor layer 62a, the insulating layer 63a, the conductive layer 64a, and the conductive layer 65a. Therefore, detailed explanations of the same are omitted. The insulating layer 50b, the insulating layer 51b, the semiconductor layer 60b, the semiconductor layer 62b, the insulating layer 63b, the conductive layer 64b, and the conductive layer 65b are respectively derived from the same layers as, and have substantially the same thicknesses as, the insulating layer 50a, the insulating layer 51a, the semiconductor layer 60a, the semiconductor layer 62a, the insulating layer 63a, the conductive layer 64a, and the conductive layer 65a. The contact plugs CS and C0 and the insulating layers 55 to 57 are also the same as those of the very-low breakdown voltage transistor VLTrP. Therefore, explanations of the same are omitted.

The semiconductor layer 61b is provided above the semiconductor layer 60b. The semiconductor layer 61b is an N-type semiconductor layer, and includes a polysilicon layer, for example, doped with phosphorus (P). Therefore, the semiconductor layer 60b is utilized as a diffusion prevention layer that prevents phosphorus contained in the semiconductor layer 61b from diffusing into the P-type well region PW through the insulating layer OXb. The semiconductor layer 62b is utilized as a diffusion prevention layer that prevents phosphorus contained in the semiconductor layer 61b from diffusing into the conductive layer 64b through the insulating layer 63b.

Figure 8:
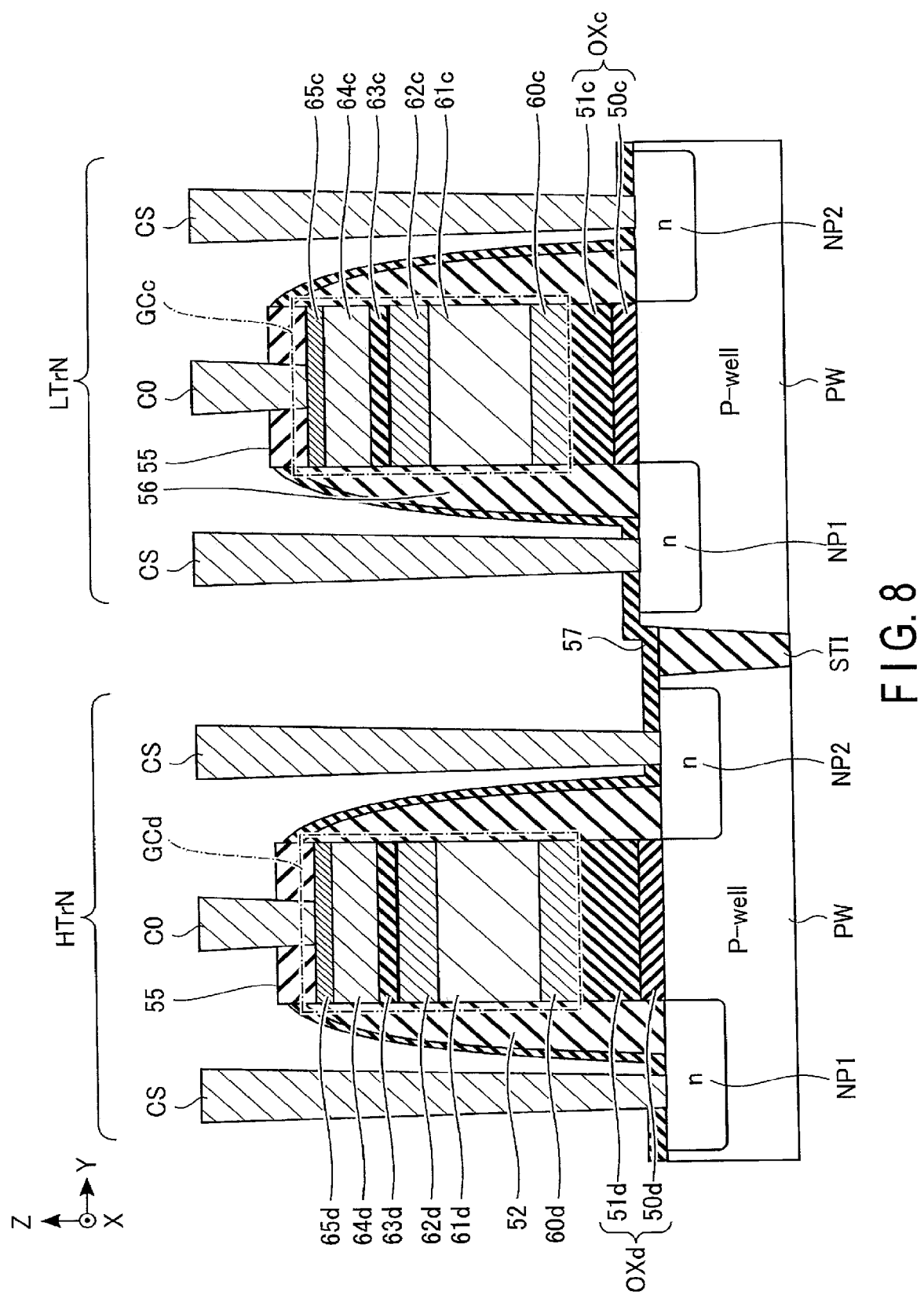

FIG. 8 illustrates an example of details of a cross-sectional structure of the control transistors HTrN and LTrN in the semiconductor memory device 1 according to the first embodiment. With regard to an example of a detailed structure of the low breakdown voltage transistor LTrN, a difference from the very-low breakdown voltage transistor VLTrN will be mainly described. As shown in FIG. 8, the region of the low breakdown voltage transistor LTrN includes the P-type well region PW, the n-type impurity diffusion regions NP1 and NP2, the gate electrode GCc, the contact plugs CS and C0, and the insulating layers OXc, 55, 56, and 57.

The insulating layer OXc, the insulating layer 50c, the insulating layer 51c, the semiconductor layers 60c to 62c, the insulating layer 63c, the conductive layer 64c, and the conductive layer 65c are respectively the same as the insulating layer OXb, the insulating layer 50b, the insulating layer 51b, the semiconductor layers 60b to 62b, the insulating layer 63b, the conductive layer 64b, and the conductive layer 65b. Therefore, detailed explanations of the same are omitted. The semiconductor layers 60c to 62c, the insulating layer 63c, the conductive layer 64c, and the conductive layer 65c are respectively derived from the same layers as, and have substantially the same thicknesses as, the semiconductor layers 60b to 62b, the insulating layer 63b, the conductive layer 64b, and the conductive layer 65b. The insulating layer 50c is formed to be substantially the same in thickness as the insulating layer 50b.

On the other hand, the insulating layer 51c is thicker than the insulating layers 51a and 51b of the very-low breakdown voltage transistors VLTrP and VLTrN. Since the insulating layer 51c is thicker than the insulating layers 51a and 51b, the low breakdown voltage transistor LTrN has a higher breakdown voltage than that of the very-low breakdown voltage transistors VLTrP and VLTrN. The insulating layer 51c is, for example, slightly thinner than about 8 nm.

The contact plugs CS and C0 and the insulating layers 55 to 57 are also the same as those of the very-low breakdown voltage transistor VLTrN. Therefore, explanations of the same are omitted.

With regard to an example of a detailed structure of the high breakdown voltage transistor HTrN, a difference from the very-low breakdown voltage transistor VLTrN will be mainly described. As shown in FIG. 8, the region of the high breakdown voltage transistor HTrN includes the P-type well region PW, the n-type impurity diffusion regions NP1 and NP2, the gate electrode GCd, the contact plugs CS and C0, and the insulating layers OXd, 55, 56, and 57.

The insulating layer OXd, the insulating layer 50d, the insulating layer 51d, the semiconductor layers 60d to 62d, the insulating layer 63d, the conductive layer 64d, and the conductive layer 65d are respectively the same as the insulating layer OXb, the insulating layer 50b, the insulating layer 51b, the semiconductor layers 60b to 62b, the insulating layer 63b, the conductive layer 64b, and the conductive layer 65b. Therefore, detailed explanations of the same are omitted. The semiconductor layer 60d to 62d, the insulating layer 63d, the conductive layer 64d, and the conductive layer 65d are respectively derived from the same layers as, and have substantially the same thicknesses as, the semiconductor layer 60b to 62b, the insulating layer 63b, the conductive layer 64b, and the conductive layer 65b. The insulating layer 50d is formed to be substantially the same in thickness as the insulating layer 50b.

On the other hand, the insulating layer 51d is thicker than the insulating layers 51c of the low breakdown voltage transistors LTrN. Since the insulating layer 51d is thicker than the insulating layers 51c, the high breakdown voltage transistor HTrN has a higher breakdown voltage than that of the low breakdown voltage transistor LTrN. The insulating layer 51d is, for example, slightly thinner than about 40 nm.

The contact plugs CS and C0 and the insulating layers 55 to 57 are also the same as those of the very-low breakdown voltage transistor VLTrN. Therefore, explanations of the same are omitted.

Figure 9:
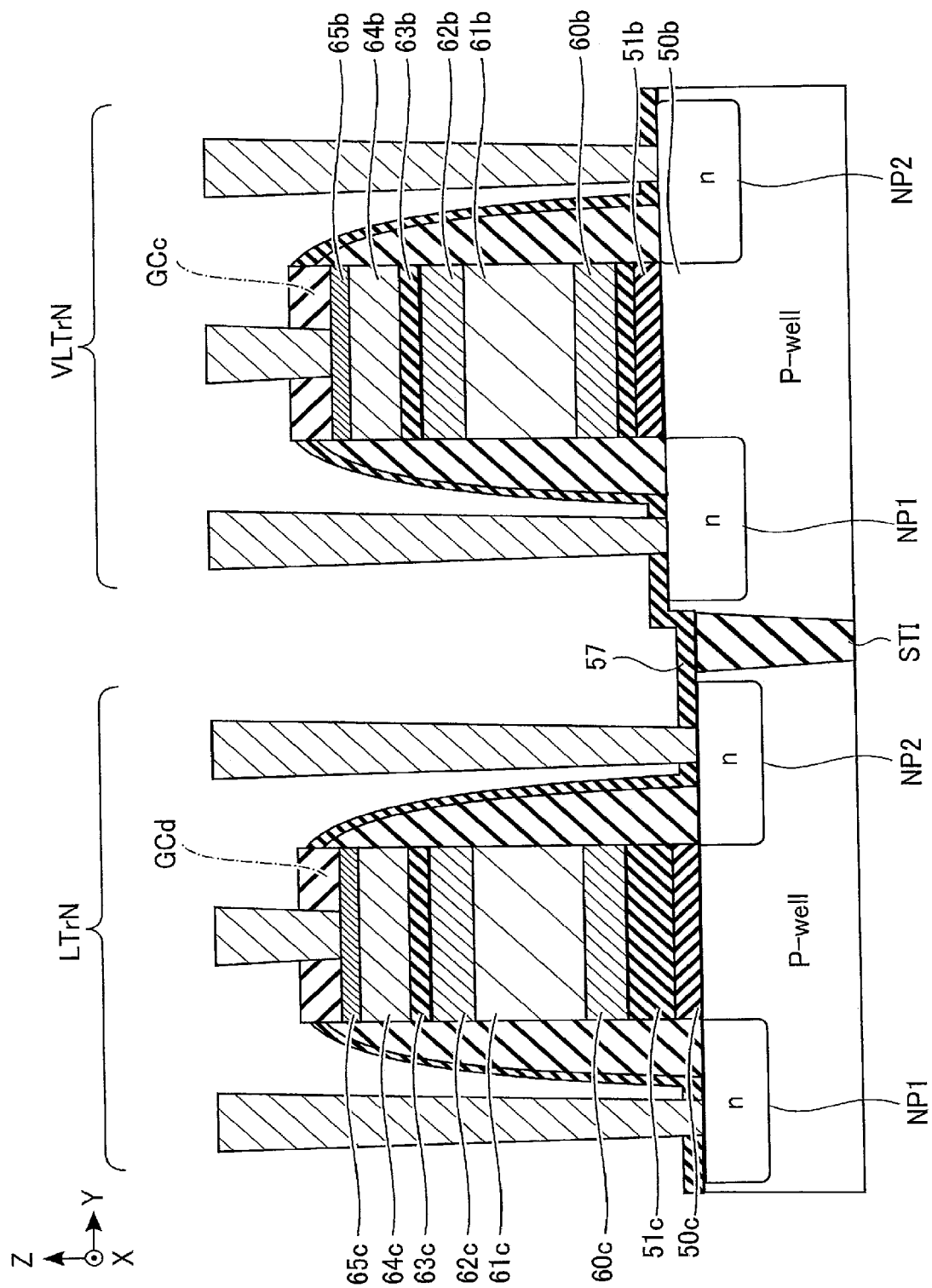

FIG. 9 shows a region including a boundary between the very-low breakdown voltage transistor VLTrN and the low breakdown voltage transistor LTrN. As described above, the insulating layer 51c is thicker than the insulating layers 51a and 51b of the very-low breakdown voltage transistors VLTrP and VLTrN, and the insulating layer 51d is thicker than the insulating layers 51c of the low breakdown voltage transistors LTrN. As will be described in detail later, the very-low breakdown voltage transistors VLTrP and VLTrN, the low breakdown voltage LTrN, and the high breakdown voltage transistor HTrN are formed partially in a common process. At least in part due to these matters, the surface of the semiconductor substrate 20 in the HTrN forming region is located at a lower position than the surface of the semiconductor substrate 20 in the LTrN forming region, and the surface of the semiconductor substrate 20 in the LTrN forming region is located at a lower position than the surface of the semiconductor substrate 20 in each of the VLTrP forming region and the VLTrN forming region.

Furthermore, the top surface of the insulating layer 50d is located at a position lower than the top surface of the insulating layer 50c, and the top surface of the insulating layer 50c is located at a position lower than each of the top surface of the insulating layers 50a and 50b. On the other hand, the top surfaces of the insulating layers 51a, 51b, 51c, and 51d are almost the same or practically the same in height. The layers above the insulating layers 51a, 51b, Sic, and 51d are practically the same in height over all of the VLTrP forming region, the VLTrN forming region, the LTrN forming region, and the HTrN forming region.

[1-2] Method of Manufacturing Semiconductor Memory Device 1

An example of the series of manufacturing steps relating to formation of the gate electrode GC of the control transistor in the semiconductor memory device 1 according to the first embodiment will be described with reference to FIG. 10 as appropriate. FIG. 10 is a flowchart showing an example of the method of manufacturing the semiconductor memory device 1 according to the first embodiment. FIGS. 11 to 18 each show an example of the cross-sectional structure in the course of manufacturing the semiconductor memory device 1 according to the first embodiment, showing a cross section similar to that of FIGS. 7 and 8.

For example, when the insulating layer 50 is formed over all of the VLTrP forming region, the VLTrN forming region, the LTrN forming region, and the HTrN forming region, the insulating layer 50 in the VLTrP forming region, the VLTrN forming region, the LTrN forming region, and the HTrN forming region may be respectively referred to as the insulating layer 50a, the insulating layer 50b, the insulating layer 50c, and the insulating layer 50d. In other words, in the case of describing all of the insulating layer 50a, the insulating layer 50b, the insulating layer 50c, and the insulating layer 50d, the common reference numeral, for example, "the insulating layer 50", is used. Such a method of expression applies to all reference numerals throughout the specification.

Figure 11:
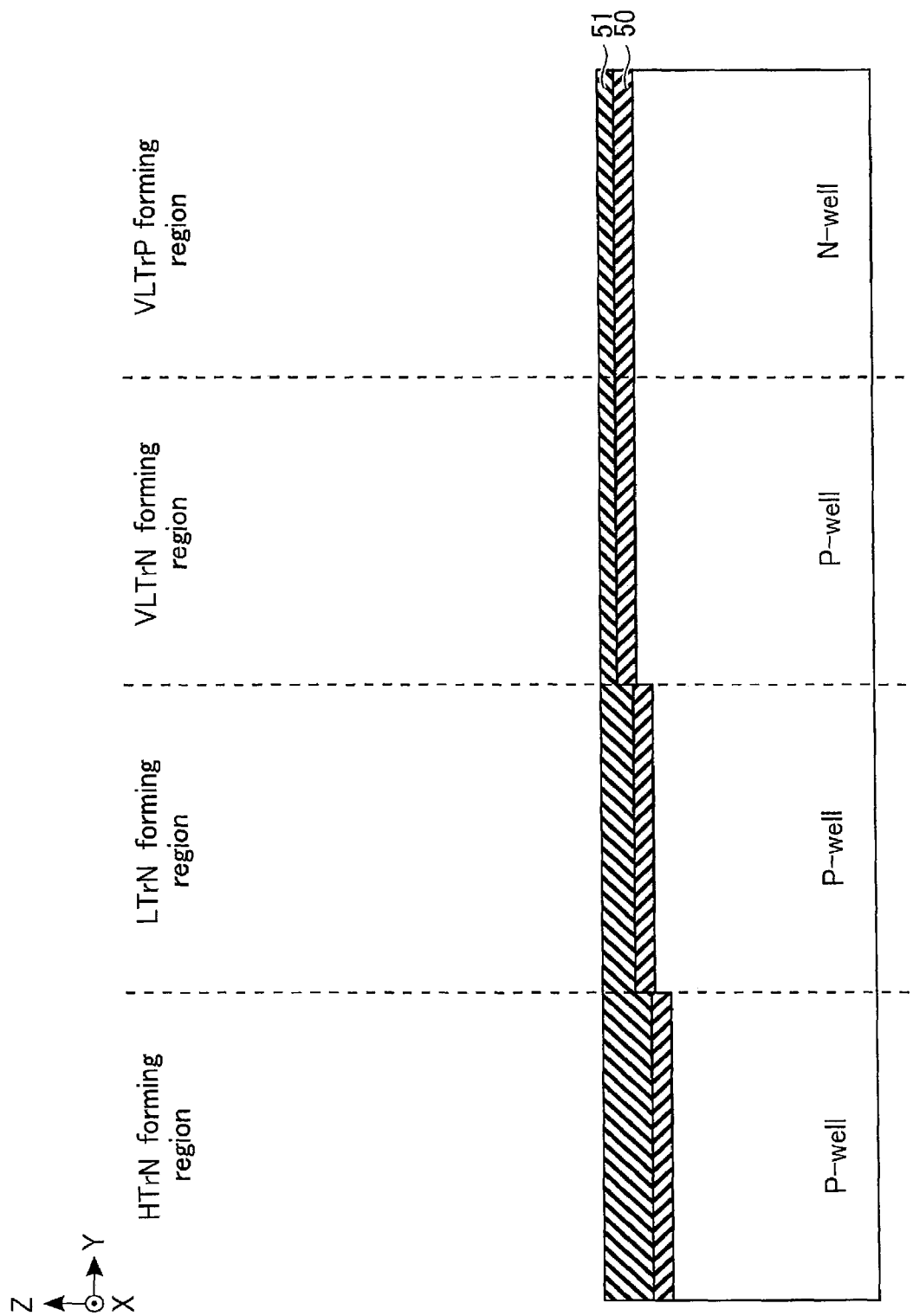

First, as shown in FIG. 11, the insulating layer OX is formed (step S101). Specifically, the insulating layer 50 and the insulating layer 51 are sequentially formed on the semiconductor substrate 20. To form these insulating layers, first, the semiconductor substrate 20 is etched so that it is thicker in the VLTrP and VLTrN forming regions, the LTrN forming region, and the HTrN forming region, in this order. The etching may be performed by oxidizing portions of the semiconductor substrate 20 that are to be removed and removing the oxidized film by wet etching. The insulating layer 50 is formed on the stepped surface of the semiconductor substrate 20. The insulating layer 51 is formed on the insulating layer 50. The insulating layer 51 is formed to be almost the same in height in the z direction over all regions. In other words, the insulating layer 51 is thicker in the HTrN forming region, the LTrN forming region, and the VLTrP and VLTrN forming regions, in this order, and the top surfaces of these regions are almost the same in height.

Figure 12:
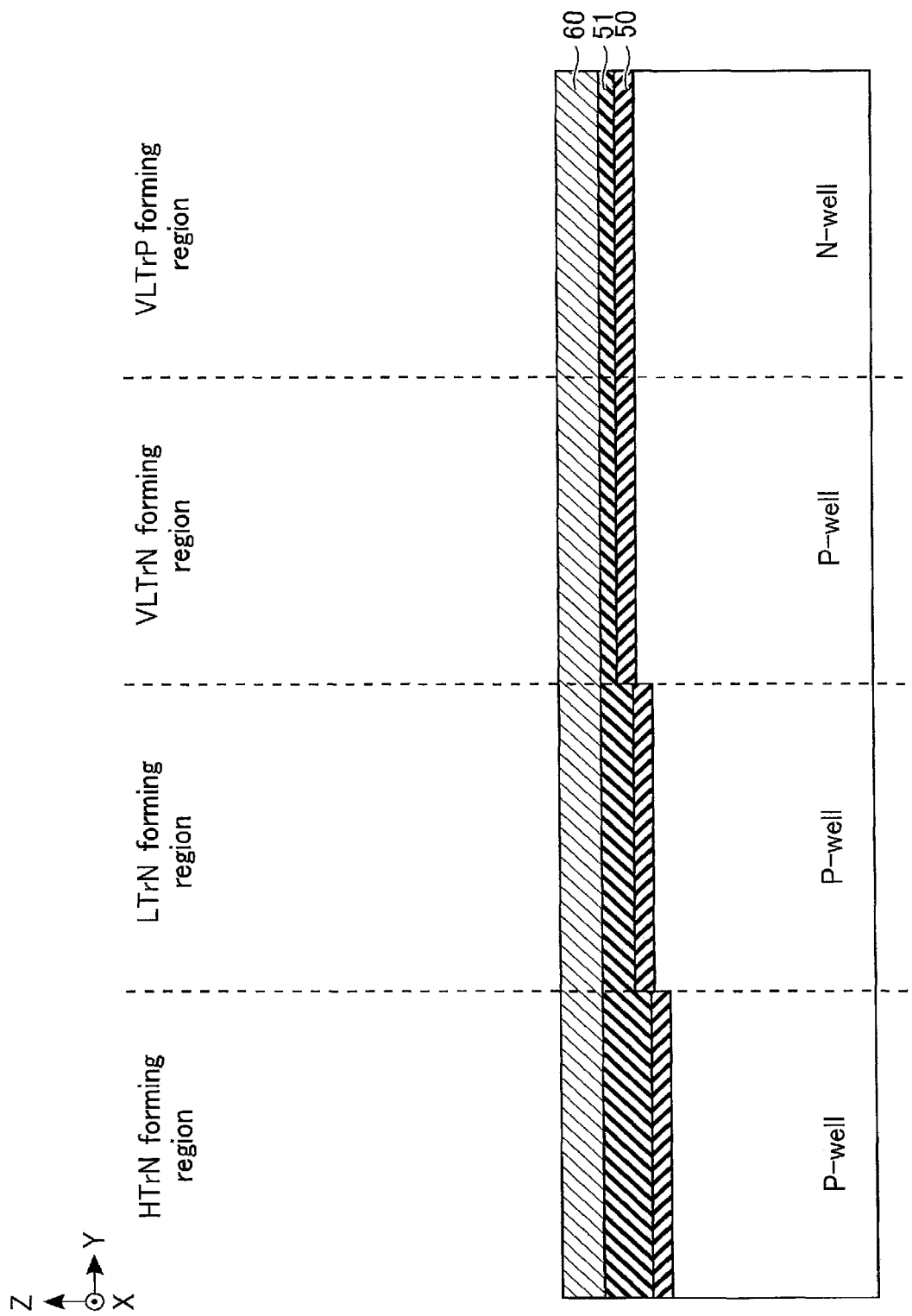

Next, as shown in FIG. 12, the semiconductor layer 60 is formed on the top surface of the insulating layer 51 (step S102). The semiconductor layer 60 may be formed by depositing non-doped polysilicon, for example, in a carbon atmosphere. Alternatively, the semiconductor layer 60 may be formed by forming non-doped polysilicon and doping carbon into polysilicon by ion implantation.

Figure 13:
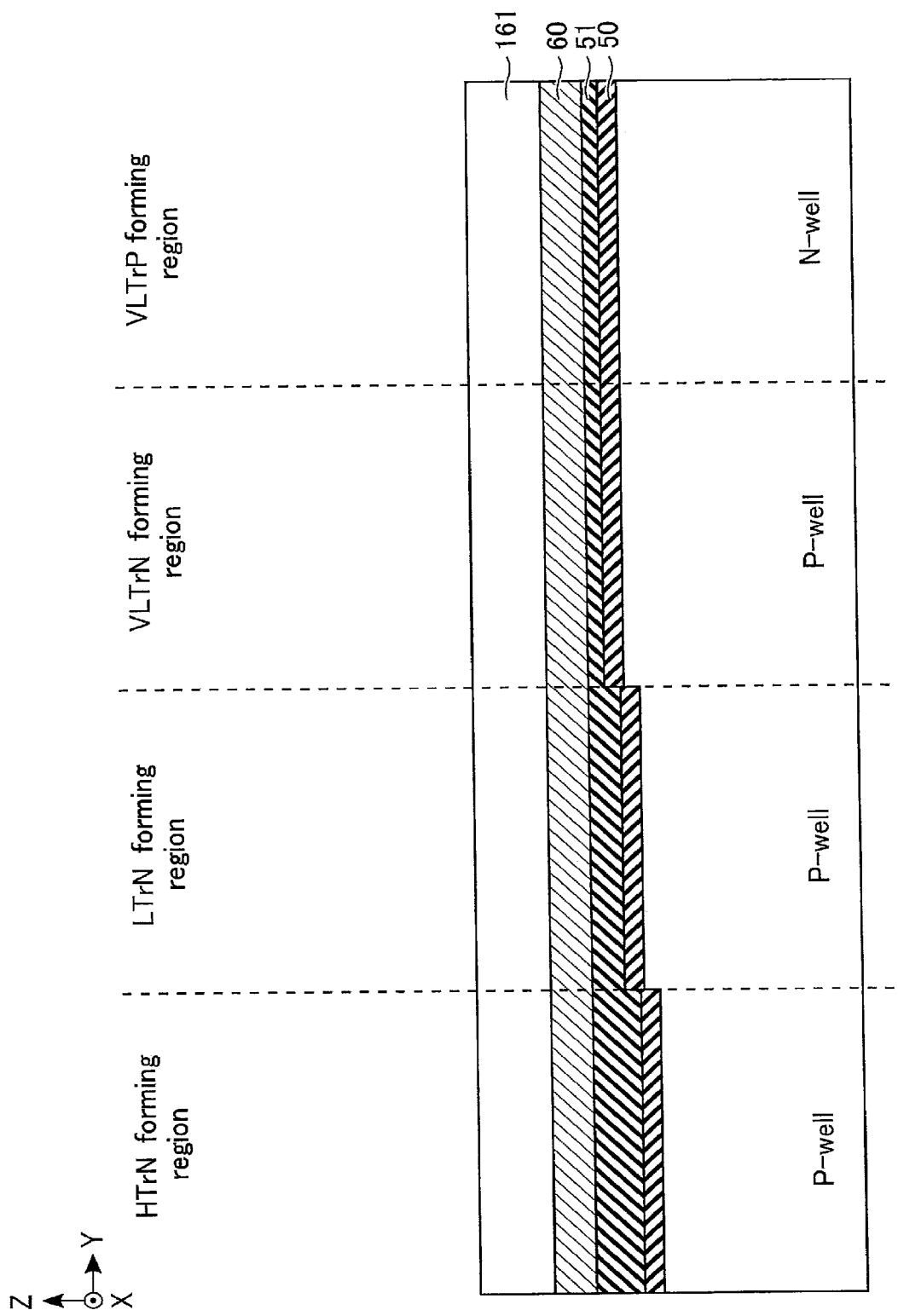

Next, as shown in FIG. 13, the semiconductor layer 161 is formed on the top surface of the insulating layer (step S103). The semiconductor layer 161 contains, for example, non-doped polysilicon.

Figure 14:
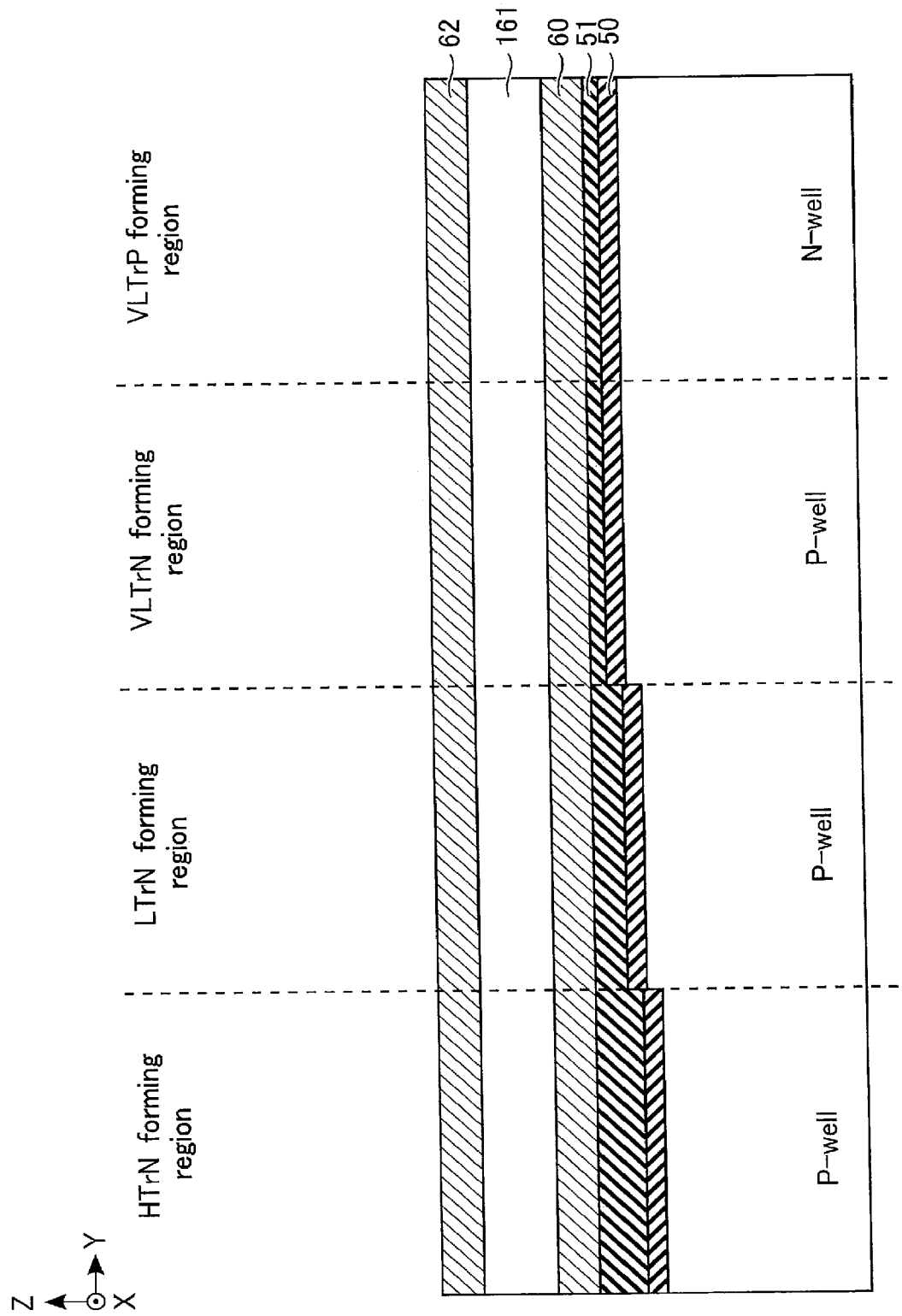

Next, as shown in FIG. 14, the semiconductor layer 62 is formed on the top surface of semiconductor layer 161 (step S104). The semiconductor layer 62 may be formed by depositing non-doped polysilicon, for example, in a carbon atmosphere. Alternatively, the semiconductor layer 62 may be formed by forming non-doped polysilicon and doping carbon into polysilicon by ion implantation.

Figure 15:
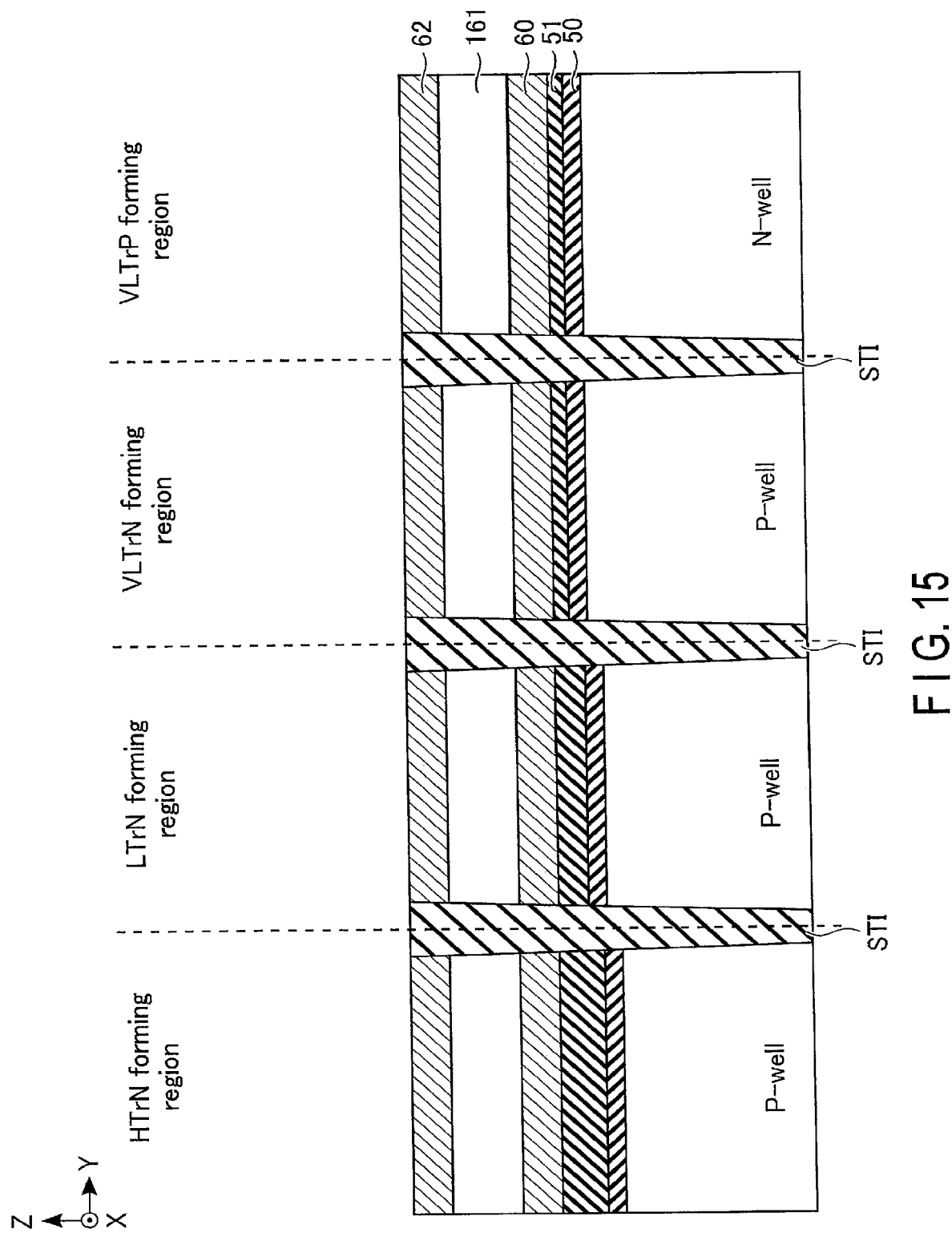

Thereafter, as shown in FIG. 15, the element isolation regions STI are formed (step S105). Specifically, regions where the element isolation regions STI are to be formed are removed by, for example, a lithography process and etching, and a space formed by the removal is filled with an insulating material. The etching in the present process is, for example, reactive ion etching (RIE). Each element isolation region STI is formed to separate the layers which have been formed into the VLTrP forming region, the VLTrN forming region, the LTrN forming region, and the HTrN forming region.

Figure 16:
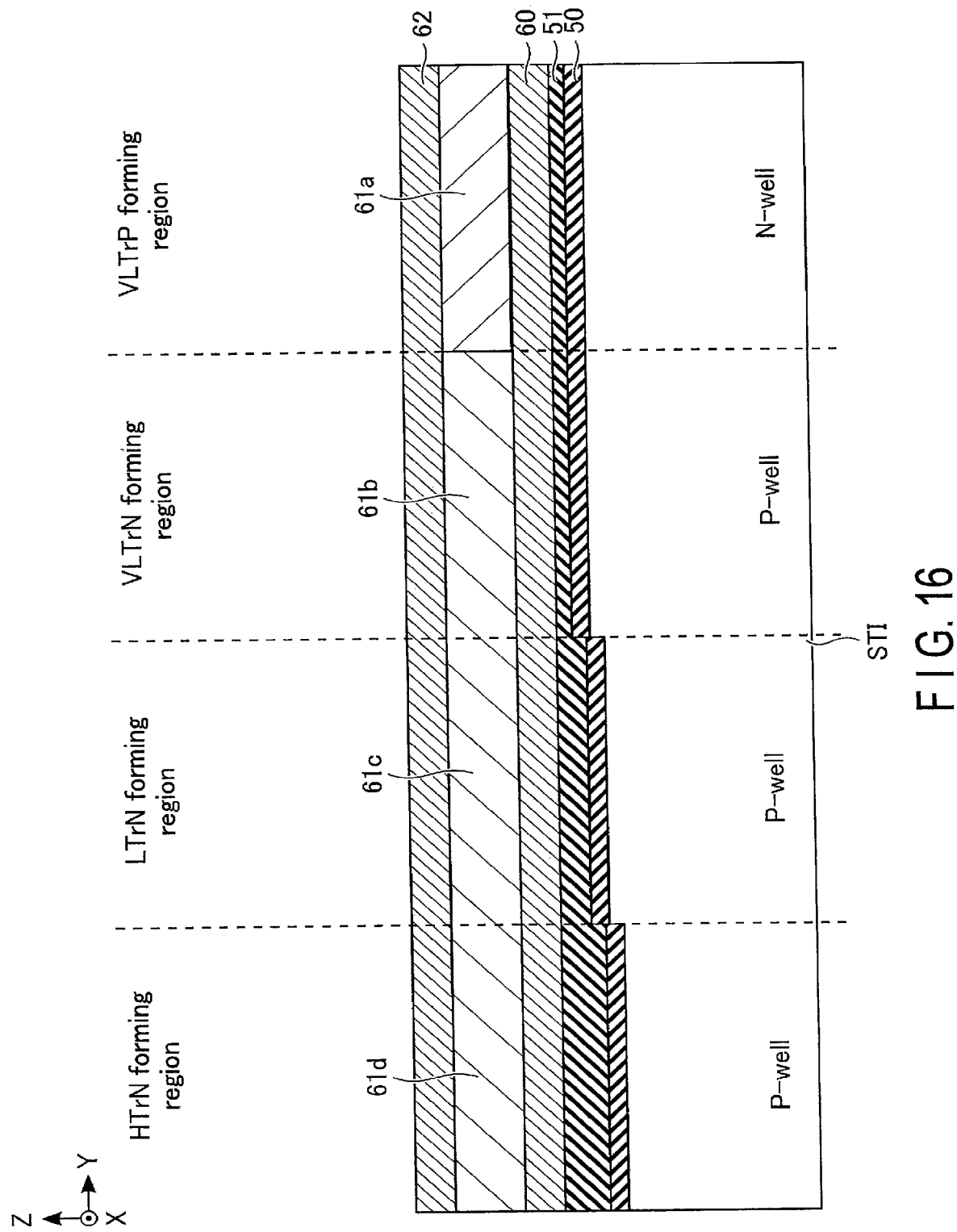

Next, as shown in FIG. 16, the semiconductor layer 61 is formed (step S106). Specifically, the semiconductor layer 61a is formed by doping boron into a semiconductor layer 161a by ion implantation, with the VLTrN forming region, the LTrN forming region, and the HTrN region being covered with a mask. The semiconductor layer 61b, the semiconductor layer 61c, and the semiconductor layer 61d are formed by doping phosphorus into a semiconductor layer 161b, a semiconductor layer 161c, and a semiconductor layer 161d, with the VLTrP forming region being covered with a mask.

Next, as shown in FIG. 17, the insulating layer 63, the conductive layers 64 and 65, and the insulating layer 55 are formed (step S107). Specifically, the insulating layer 63 is formed on the top surface of the semiconductor layer 61 and the element isolation regions STI. The conductive layers 64 and 65 are sequentially formed on the top surface of the insulating layer 63. The insulating layer 55 is formed on the top surface of the conductive layer 65. The insulating layer 63 may be formed by thermal treatment, such as thermal oxidation, or natural oxidation.

Figure 18:
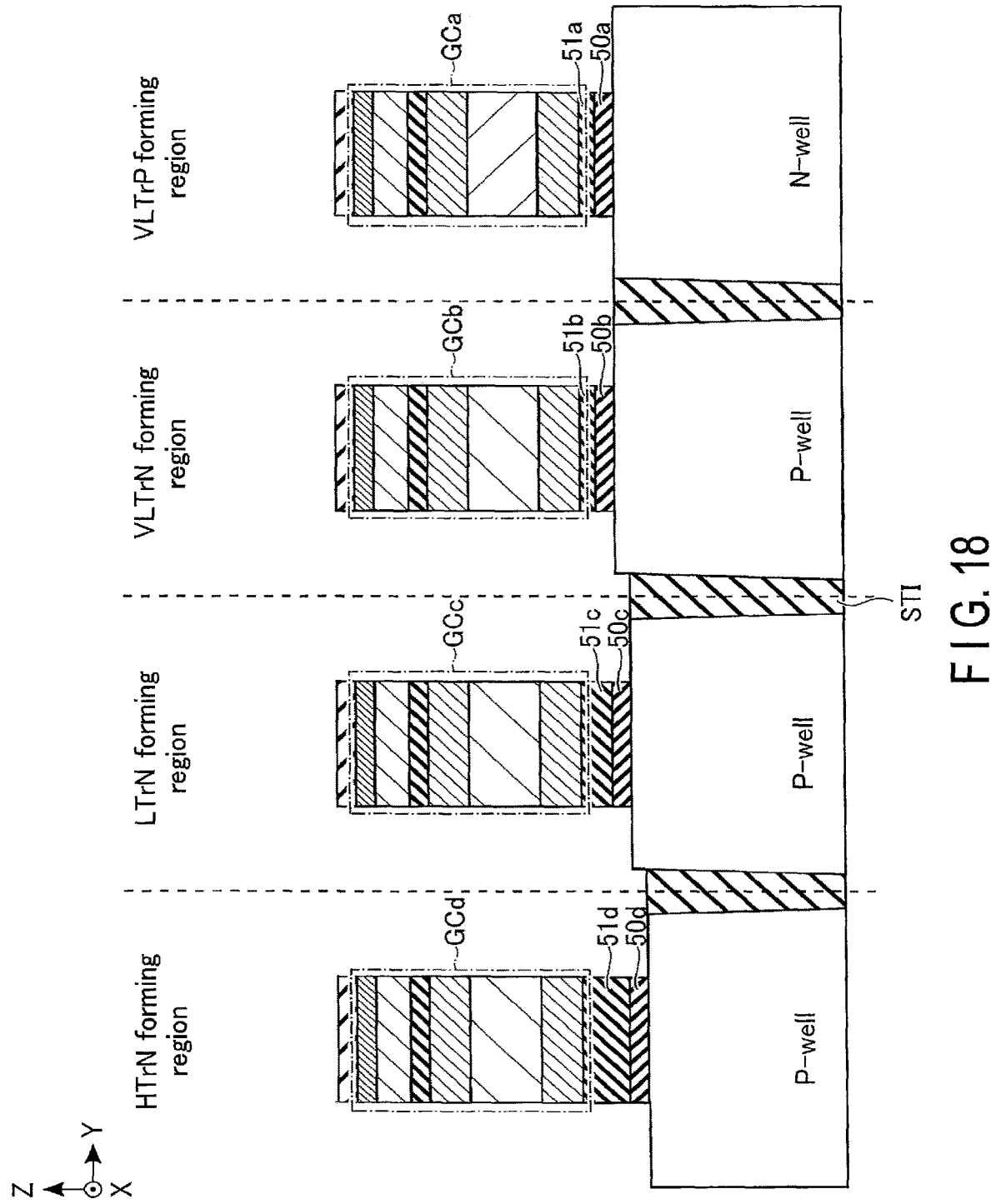

Next, as shown in FIG. 18, the gate electrode GC is formed (step S108). Specifically, of the layers stacked above the semiconductor substrate 20, a part of the element isolation region STI and a portion around the element isolation region STI are removed by etching. The layers stacked above the semiconductor substrate 20 are divided into the VLTrP forming region, the VLTrN forming region, the LTrN forming region, and the HTrN forming region. As a result, the gate electrodes GCa, GCb, GCc, and GCd are formed from the remaining stacked structure. Furthermore, the insulating layers 50a, 51a, 50b, 51b, 50c, 51c, 50d, and 51d are formed. The etching in the present process is, for example, RIE. RIE may be performed a plurality of times.

Next, as shown in FIGS. 7 and 8, the n-type impurity diffusion regions NP1 and NP2, the p-type impurity diffusion regions PP1 and PP2, the insulating layers 56, 57 and 40, and the contact plugs CS and C0 are formed.

The above-described manufacturing steps are mere examples. Another step may be interposed between manufacturing steps, and the order of the manufacturing steps may be altered unless a problem occurs.

[1-3] Advantages (Effects) of First Embodiment

The semiconductor memory device 1 according to the first embodiment described above can suppress deterioration of electrical characteristics of the control transistors, so that a high-quality semiconductor device can be provided. Advantages of the semiconductor memory device 1 according to the first embodiment will be explained in detail below.

Characteristics of a control transistor used in a semiconductor device may deteriorate during manufacturing, depending on the structure in the semiconductor layer. For example, in a P-type transistor and an N-type transistor adjacent to each other, the dopants in the semiconductor layers, i.e., boron and phosphorus, may mutually diffuse through tungsten silicide in the gate electrode (for example, the conductive layer 64). A possible structure to prevent the diffusion is to provide an insulating layer (for example, the insulating layer 63) between tungsten silicide and doped silicon. However, if the insulating layer is thick, the resistance of the connection contact with the conductive layer above the insulating layer will increase. In this case, the operation speed of the transistor may be reduced. In particular, when the transistor is a very-low breakdown voltage transistor, the transistor may not operate at a high speed. On the other hand, if the insulating layer is thin, it may be impossible to prevent boron from diffusing.

Furthermore, boron and phosphorus in the semiconductor layers of the gate electrodes in the control transistors may diffuse into the semiconductor substrate side. In this case, the threshold voltages of the transistors may deviate from a desired range, and accordingly the transistor characteristics may vary. In particular, if the dopants, such as boron and phosphorus, are implanted from above, after non-doped silicon is formed above the semiconductor substrate, boron and phosphorus may easily penetrate into the semiconductor substrate side.

The above-described diffusion of boron and phosphorus is caused by high-temperature heat treatment in manufacturing steps to form the memory cell. Namely, when the control transistor is formed or when a high-temperature treatment such as thermal diffusion is performed thereafter in manufacturing steps to form a memory cell, the above-described deterioration in the transistor operation may be prominent.

Figure 19:
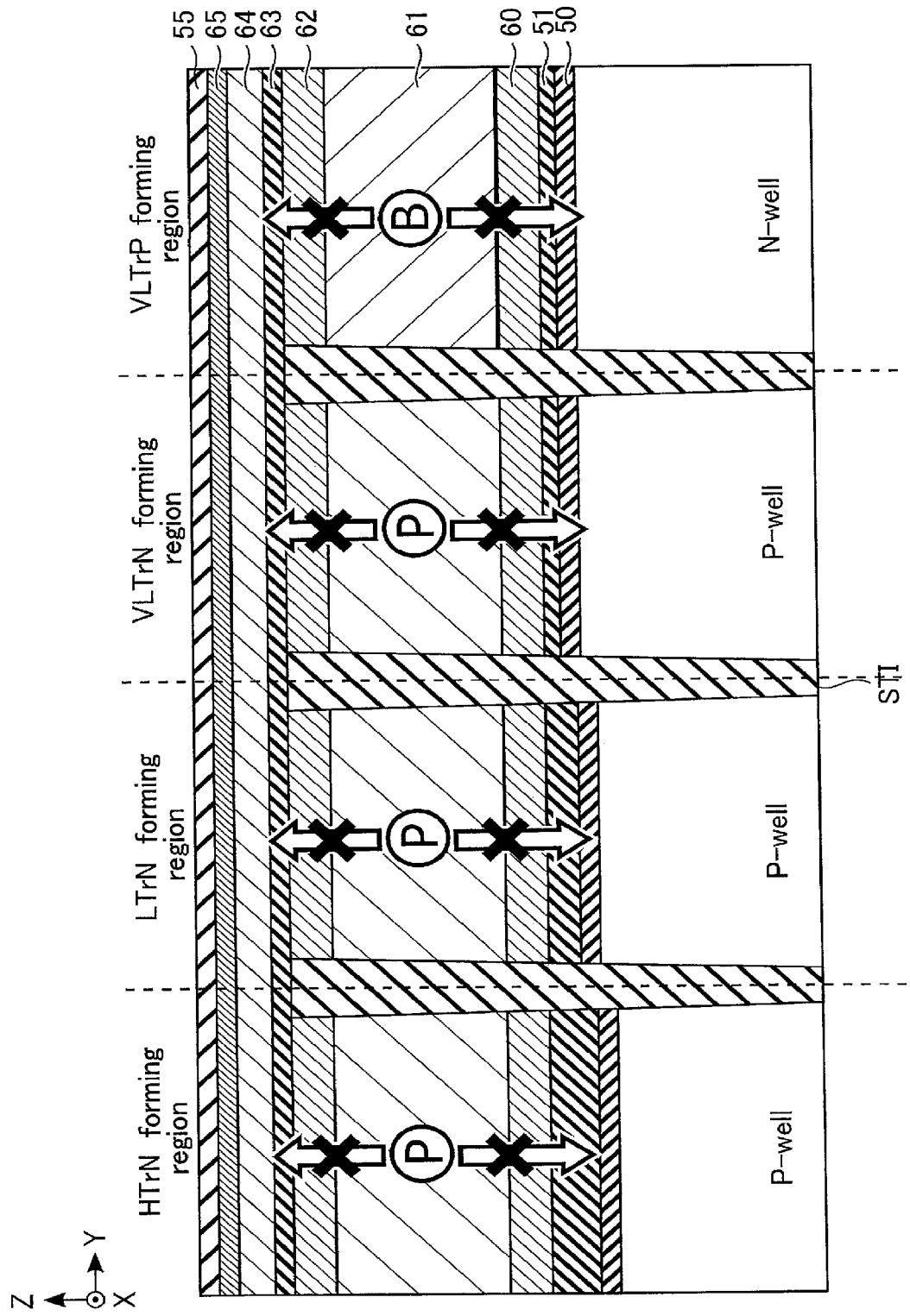
FIG. 19 is a conceptual diagram showing movements of boron and phosphorus in FIG. 16.

FIG. 19 is a conceptual diagram representing a movement of boron and phosphorus in the structure shown in FIG. 17. The semiconductor memory device 1 of the first embodiment, as shown in FIG. 19, has a structure in which the semiconductor layer 61 is sandwiched between the semiconductor layers 60 and 62. The semiconductor layers 60 and 62 contain carbon. Carbon included in silicon suppresses diffusion of boron and phosphorus. Therefore, the semiconductor layer 62 can prevent boron and phosphorus included in the semiconductor layer 61 from diffusing into the conductive layer 64. Furthermore, due to the very thin insulating layer 63, diffusion of boron and phosphorus into the conductive layer 64 can be further prevented.

The semiconductor layer 60 can also prevent boron and phosphorus included in the semiconductor layer 61 from diffusing into the semiconductor substrate 20.

In the following, advantages of the manufacturing process in the structures of the gate electrodes of the semiconductor memory device 1 according to the first embodiment will be described. As described above, in all regions for forming the control transistors HTrN, LTrN, VLTrN and VLTrP, the semiconductor layers 60 and 62 sandwich the semiconductor layer 61. Thus, the semiconductor layers 60 and 62 can be formed in one step in all regions. Specifically, in the semiconductor memory device 1 according to the first embodiment, when forming a stacked structures of the gate electrodes, the layers can be formed in one step in all regions for forming the control transistors HTrN, LTrN, VLTrN and VLTrP, except for the step of adjusting the height of the semiconductor substrate 20 and the step of implanting the dopant into the semiconductor layer 61. Thus, the semiconductor memory device 1 of the first embodiment allows for facilitated manufacturing process.

As described above, the semiconductor memory device 1 according to the first embodiment can suppress the diffusion of boron and phosphorus in the semiconductor layers, even if the semiconductor memory device is manufactured through a high-temperature heat treatment performed after forming the control transistors. Thus, the semiconductor memory device 1 of the first embodiment can provide high-quality control transistors. Furthermore, the semiconductor memory device 1 of the first embodiment allows for facilitated manufacturing process.

[2] Second Embodiment

Hereinafter, a semiconductor memory device 1 according to the second embodiment will be described.

[2-1] Structure of Control Transistor

In the second embodiment, the gate electrode GC further includes a very thin insulating layer 70 in the semiconductor layer 61. The rest of the structure of the second embodiment is almost the same as in the first embodiment. In the following, points of the semiconductor memory device 1 according to the second embodiment that are different from the first embodiment will be mainly explained.

Figure 20:
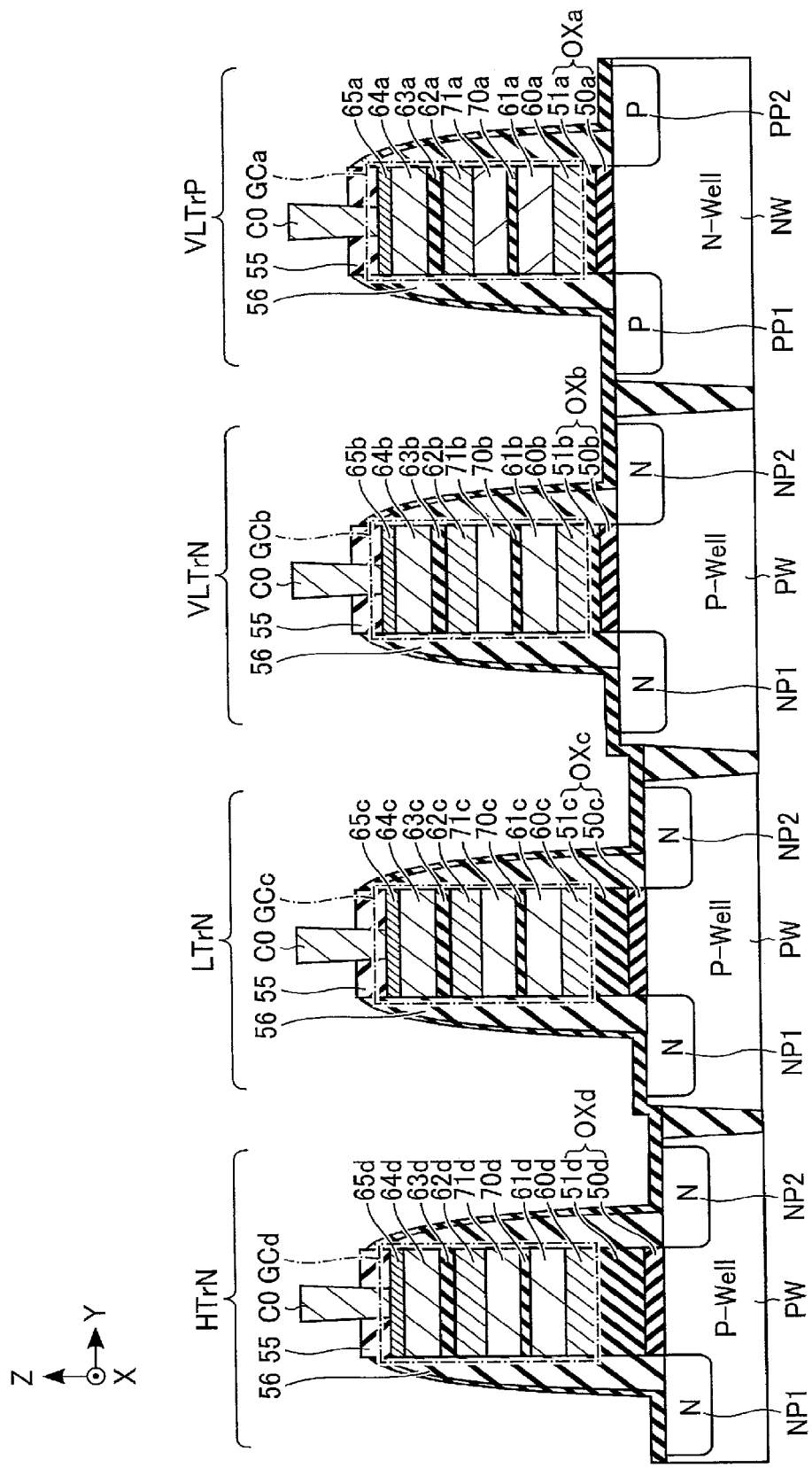
FIG. 20 is a cross-sectional view showing an example of a cross-sectional structure of a control transistor included in the semiconductor memory device according to a second embodiment.

Details of the structure of the control transistors HTrN, LTrN, VLTrN, and VLTrP will be described with reference to FIG. 20. Depiction of the insulating layer 40 is omitted from FIG. 20. FIG. 20 shows the same portions as those shown in FIG. 7 and FIG. 8 corresponding to the first embodiment.

As shown in FIG. 20, the gate electrode GC of the second embodiment differs from the gate electrode GC of the first embodiment in the structure of the portion referred to as the semiconductor layer 61 in the first embodiment. In the following, the portion of the second embodiment that corresponds to the semiconductor layer 61 of the first embodiment will be described.

The portion that corresponds to the semiconductor layer 61 of the first embodiment has a multi-layered structure including a semiconductor layer 61, an insulating layer 70, and a semiconductor layer 71 in the second embodiment.

First, in the very-low breakdown voltage transistor VLTrP, the semiconductor layer 61a is provided above the semiconductor layer 60a. The semiconductor layer 61a is a P-type semiconductor layer, and includes a polysilicon layer, for example, doped with boron; namely, it includes, for example, practically the same material as that of the semiconductor layer 61a of the first embodiment.

An insulating layer 70a is provided above the semiconductor layer 61a. The insulating layer 70a contains, for example, silicon oxide. The insulating layer 70a may be a natural oxide film. The insulating layer 70a has a film thickness in the Z direction that does not impair conductivity between the upper and lower films.

A semiconductor layer 71a is provided above the insulating layer 70a. The semiconductor layer 71a is a P-type semiconductor layer, and includes a polysilicon layer, for example, doped with boron; namely, it includes, for example, practically the same material as that of the semiconductor layer 61a of the first embodiment.

The semiconductor layer 62a is provided above the semiconductor layer 71a, and the structure above the semiconductor layer 71a is the same as that in the first embodiment.

Next, in the very-low breakdown voltage transistor VLTrN, the semiconductor layer 61b is provided above the semiconductor layer 60b. The semiconductor layer 61b is an N-type semiconductor layer, and includes a polysilicon layer, for example, doped with phosphorus; namely, it includes, for example, practically the same material as that of the semiconductor layer 61b of the first embodiment.

Since the insulating layer 70b is the same as the insulating layer 70a, detailed descriptions thereof are omitted.

The semiconductor layer 71b is provided above the insulating layer 70b. The semiconductor layer 71b is an N-type semiconductor layer, and includes a polysilicon layer, for example, doped with phosphorus; namely, it includes, for example, practically the same material as that of the semiconductor layer 61b of the first embodiment.

The semiconductor layer 61b, the insulating layer 70b, and the semiconductor layer 71b are respectively derived from the same layers as, and have substantially the same thicknesses as, the semiconductor layer 61a, the insulating layer 70a, and the semiconductor layer 71a.

The semiconductor layer 62b is provided above the semiconductor layer 71b, and the structure above the semiconductor layer 71b is the same as that in the first embodiment.

Next, the low breakdown voltage transistor LTrN will be described. The semiconductor layer 61c, the insulating layer 70c, and the semiconductor layer 71c are respectively the same as the semiconductor layer 61b, the insulating layer 70b, and the semiconductor layer 71b. Therefore, detailed explanations of the same are omitted.

The semiconductor layer 61c, the insulating layer 70c, and the semiconductor layer 71c are respectively derived from the same layers as, and have substantially the same thicknesses as, the semiconductor layer 61b, the insulating layer 70b, and the semiconductor layer 71b.

The semiconductor layer 62c is provided above the semiconductor layer 71c, and the structure above the semiconductor layer 71c is the same as that in the first embodiment.

Next, the high breakdown voltage transistor HTrN will be described. The semiconductor layer 61d, the insulating layer 70d, and the semiconductor layer 71d are respectively the same as the semiconductor layer 61b, the insulating layer 70b, and the semiconductor layer 71b. Therefore, detailed explanations of the same are omitted.

The semiconductor layer 61d, the insulating layer 70d, and the semiconductor layer 71d are respectively derived from the same layers as, and have substantially the same thicknesses as, the semiconductor layer 61b, the insulating layer 70b, and the semiconductor layer 71b.

The semiconductor layer 62d is provided above the semiconductor layer 71d, and the structure above the semiconductor layer 71d is the same as that in the first embodiment.

[2-2] Manufacturing Method of Semiconductor Memory Device 1

Figure 21:
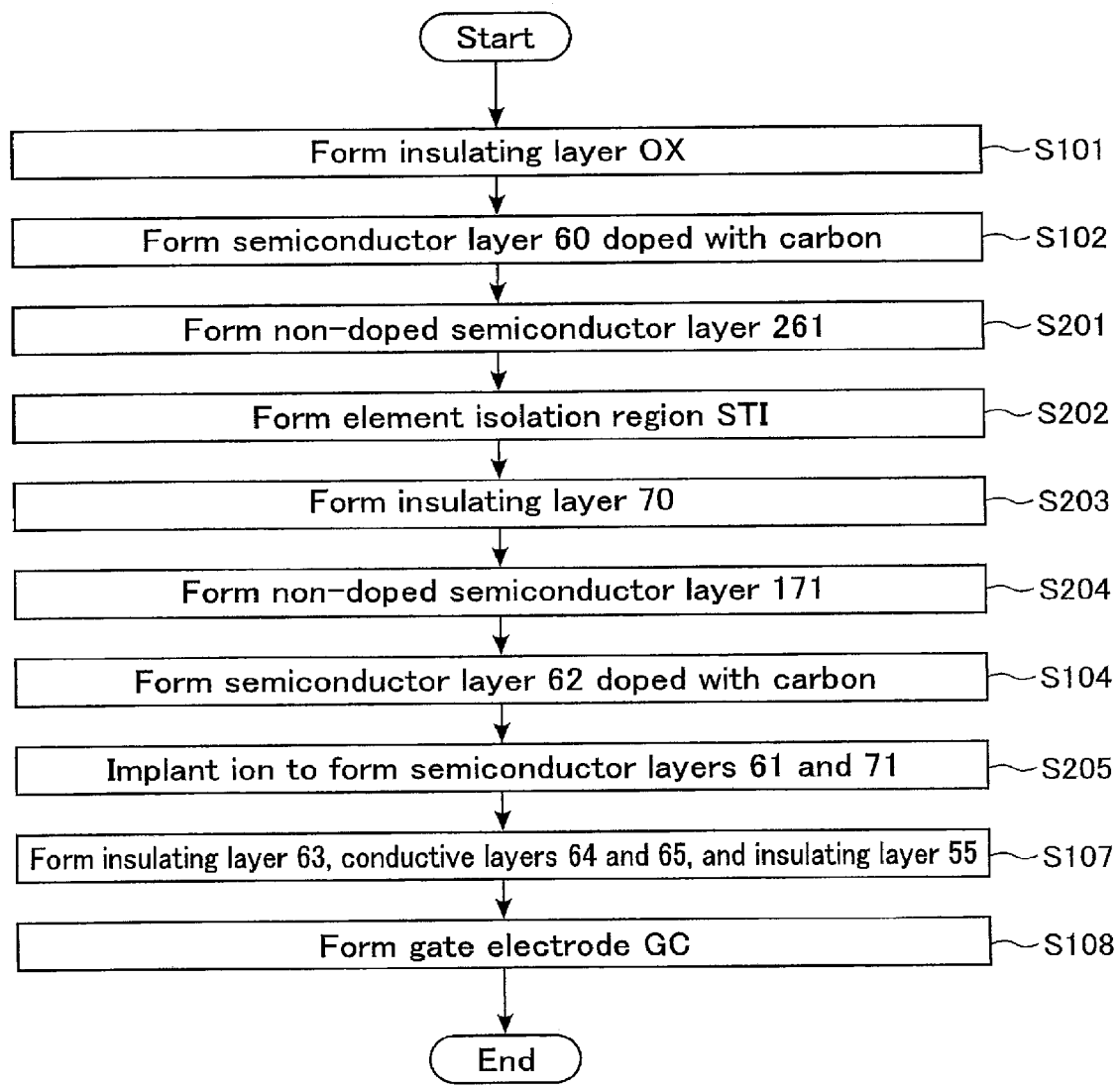
FIG. 21 is a flowchart showing an example of a method of manufacturing the semiconductor memory device according to the second embodiment.

An example of the series of manufacturing steps relating to formation of the gate electrodes GC of the control transistors in the semiconductor memory device 1 according to the second embodiment will be described with reference to FIG. 21 as appropriate. FIG. 21 is a flowchart showing an example of a method of manufacturing the semiconductor memory device 1 according to the second embodiment. FIGS. 22 to 26 each show an example of the cross-sectional structure in the course of manufacturing the semiconductor memory device 1 according to the second embodiment, showing a cross section similar to that of FIG. 18.

First, the processes of steps S101 to S104 are sequentially performed as in the first embodiment.

Figure 22:
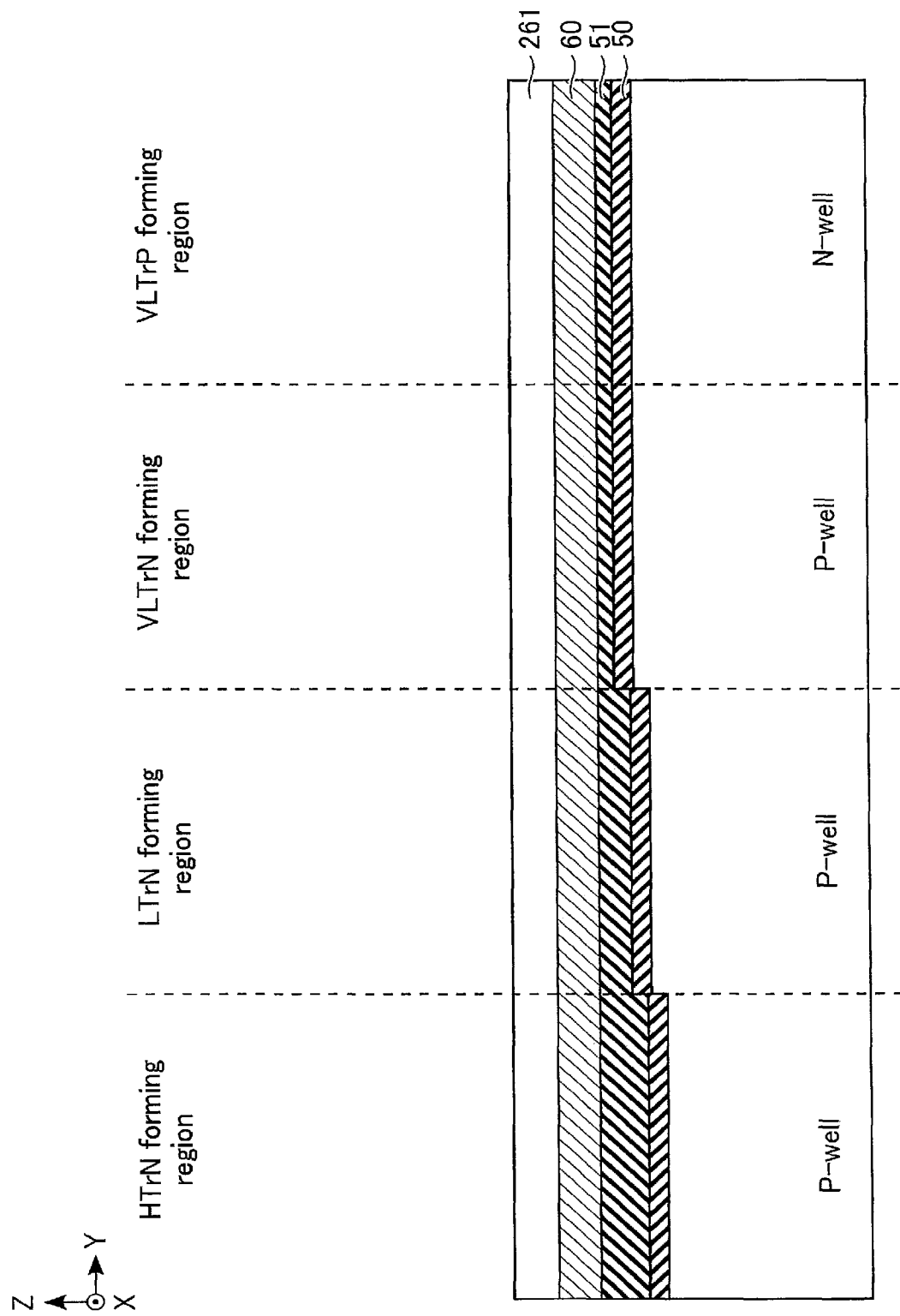

Next, as shown in FIG. 22, a semiconductor layer 261 is formed on the top surface of the insulating layer 60 (step S201). The semiconductor layer 261 contains, for example, non-doped polysilicon. At this time, the semiconductor layer 261 in the Z direction is thinner than the semiconductor layer 61 of the first embodiment; it may be about half as thick as the semiconductor layer 61.

Next, as shown in FIG. 23, the element isolation regions STI are formed (step S202). Specifically, regions where the element isolation regions STI are to be formed are removed by, for example, a lithography process and etching, and a space formed by the removal is filled with an insulating material. The etching in the present process is, for example, RIE. The element isolation regions STI are formed to separate the layers which have been formed into the VLTrP forming region, the VLTrN forming region, the LTrN forming region, and the HTrN forming region.

Figure 24:
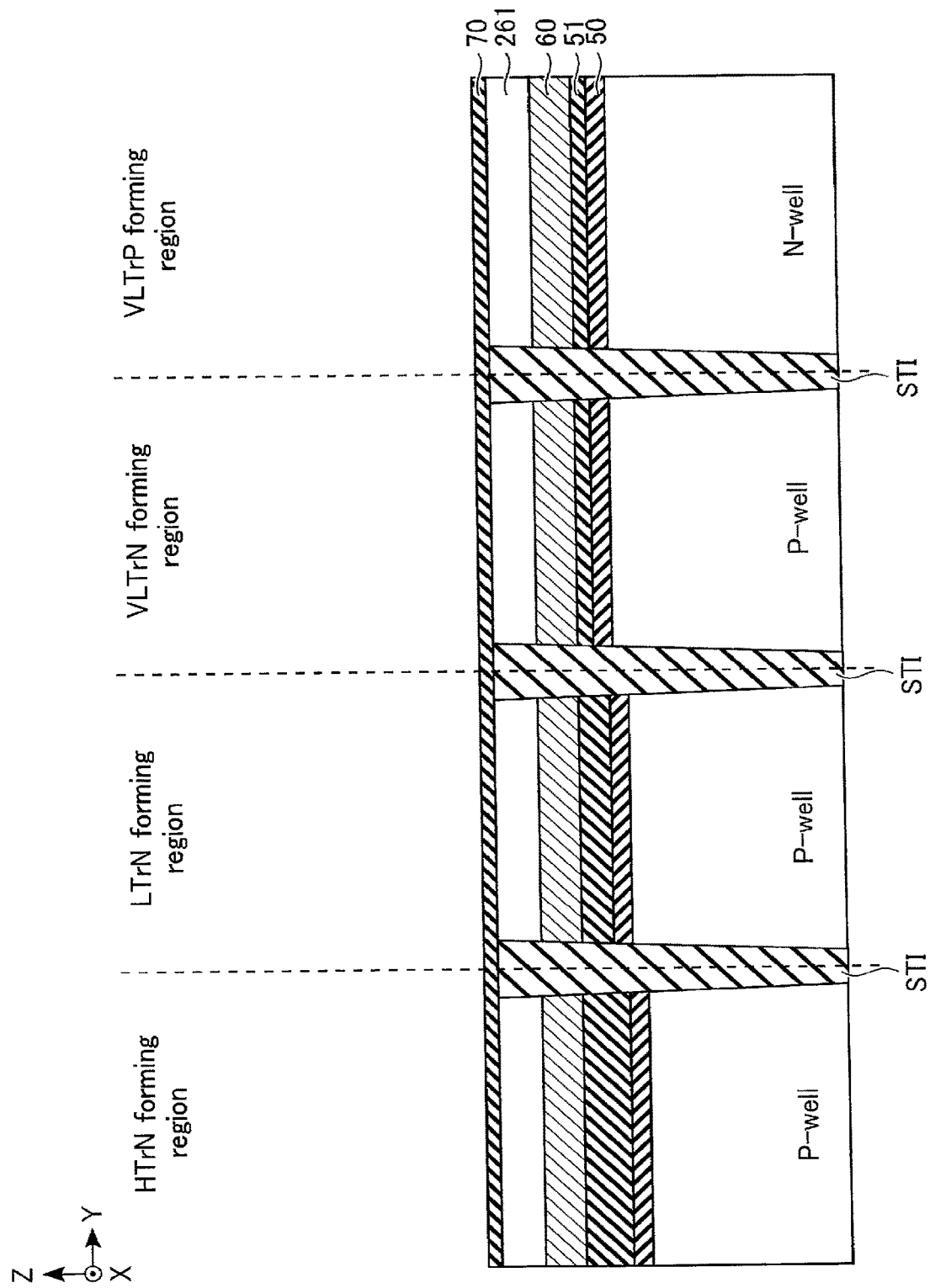

Next, as shown in FIG. 24, the insulating layer 70 is formed on the top surfaces of the semiconductor layer 261 and the element isolation regions STI (step S203). The insulating layer 70 may be formed by thermal treatment, such as thermal oxidation, or natural oxidation.

Figure 25:
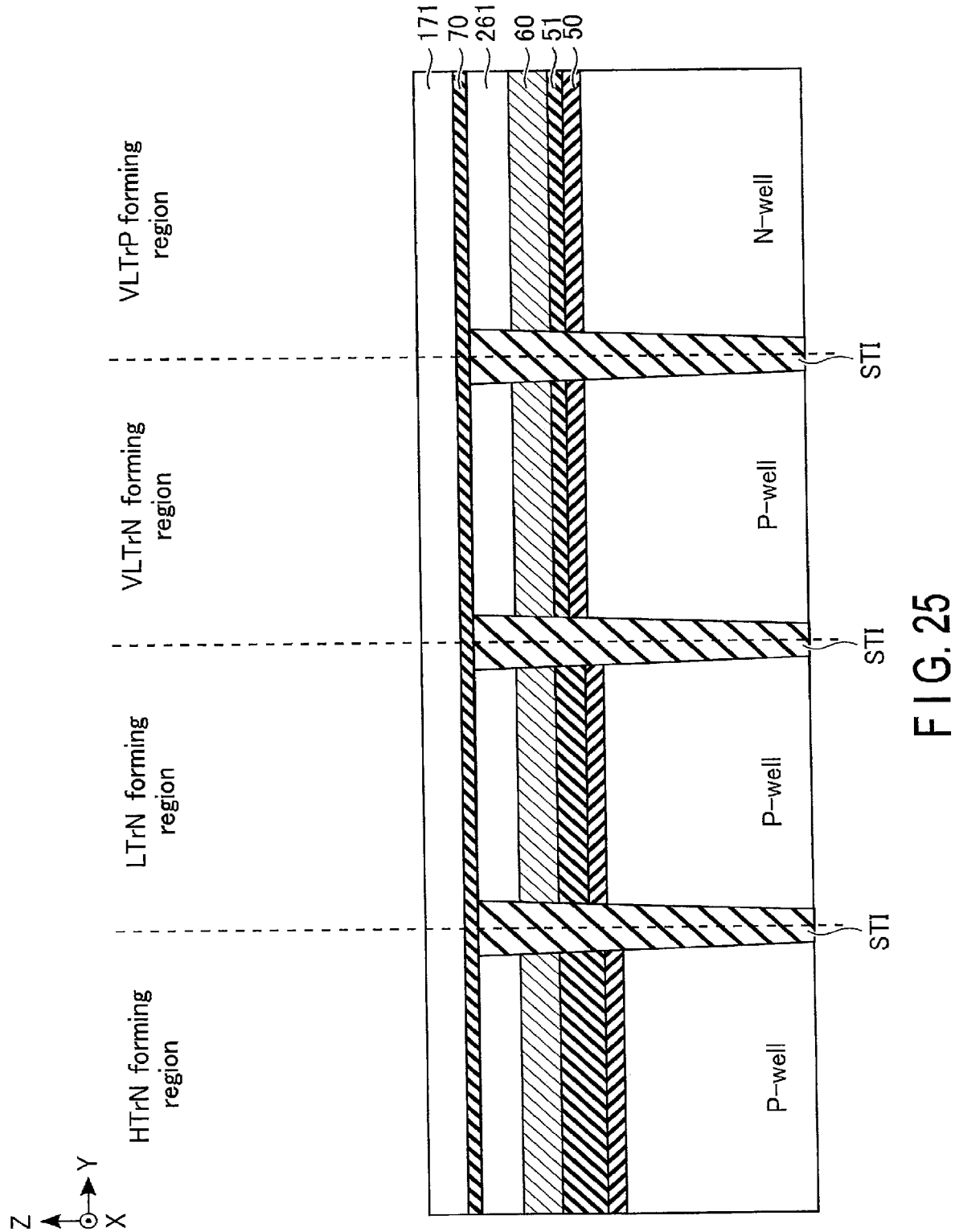

Next, as shown in FIG. 25, the semiconductor layer 171 is formed on the top surface of the insulating layer (step S204). The semiconductor layer 171 contains, for example, non-doped polysilicon. At this time, the semiconductor layer 171 in the Z direction is thinner than the semiconductor layer 61 of the first embodiment; it may be about half as thick as the semiconductor layer 61.

Next, step S104 is performed in the same manner as in the first embodiment, and the semiconductor layer 62 is formed.

Next, as shown in FIG. 26, the semiconductor layers 61 and 71 are formed (step S204). Specifically, the semiconductor layers 61a and 71a are formed by doping boron into semiconductor layers 261a and 171a by ion implantation, with the VLTrN forming region, the LTrN forming region, and the HTrN region being covered with a mask. The semiconductor layers 61b and 71b, the semiconductor layer 61c and 71c, and the semiconductor layer 61d and 71d are formed by doping phosphorus into semiconductor layer 261b and 171b, semiconductor layers 261c and 171c, and semiconductor layers 261d and 171d, with the VLTrP forming region being covered with a mask.

Thereafter, the processes of steps S107 and S108 are sequentially performed as in the first embodiment. As a result, the gate electrodes GC are formed in the second embodiment. The manufacturing processes have been described as an example, and other processes may be inserted between the processes described.

[2-3] Advantages (Effects) of Second Embodiment

According to the semiconductor memory device 1 of the second embodiment, the same effects as those of the first embodiment can be obtained more effectively.

Each gate electrode GC of the second embodiment includes the semiconductor layers 60 and 62 containing carbon as in the first embodiment. Therefore, the same advantage as in the first embodiment can be obtained.

Furthermore, each gate electrode GC of the second embodiment includes the insulating layer 70. Due to the insulating layer 70, when the dopants, such as boron and phosphorus, are implanted from above, the gate electrode GC of the second embodiment can further suppress penetration of boron and phosphor into the semiconductor substrate side. This is because the insulating layer 70 suppresses penetration of dopants etc., which have been implanted with excess energy due to variations of the apparatus or the like, into the substrate.

As described above, according to the semiconductor memory device 1 of the second embodiment, the same effects as those of the first embodiment can be obtained more effectively.

[3] Third Embodiment

Hereinafter, a semiconductor memory device 1 according to the third embodiment will be described.

[3-1] Structure of Control Transistor

In the third embodiment, the control gate electrodes GCb, GCc, and GCd of the control transistors VLTrN, LTrN, and HTrN do not include some of the semiconductor layers (for example, the semiconductor layer 62) containing carbon. The rest of the structure of the third embodiment is almost the same as in the first embodiment. In the following, points of the semiconductor memory device 1 according to the third embodiment that are different from the first embodiment will be mainly explained.

Details of the structures of the control transistors HTrN, LTrN, VLTrN and VLTrP will be explained with reference to FIG. 27. Depiction of the insulating layer 40 is omitted from FIG. 27. FIG. 27 shows the same portions as those shown in FIG. 7 and FIG. 8 corresponding to the first embodiment.

As shown in FIG. 27, the gate electrodes GCb, GCc, and GCd of the control transistors VLTrN, LTrN, and HTrN of the third embodiment do not include a semiconductor layer which contains carbon (for example, the semiconductor layer 62) between the semiconductor layer 61b and the insulating layer 63b, between the semiconductor layer 61c and the insulating layer 63c, and between the semiconductor layer 61*d* and the insulating layer 63*d*, respectively. The structures of the gate electrodes GC of the third embodiment will be described below.

In the very-low breakdown voltage transistor VLTrP, the structure of the gate electrode GCa of the third embodiment is the same as that of the gate electrode GCa of the first embodiment.

In the very-low breakdown voltage transistor VLTrN, the gate electrode GCb does not include a semiconductor layer which contains carbon (for example, the semiconductor layer 62*b*) between the semiconductor layer Glb and the insulating layer 63*b*. In other words, the insulating layer 63*b* is provided on the top surface of the semiconductor layer 61*b*.

The semiconductor layer 61*b* of the third embodiment is thicker than that of the first embodiment due to the absence of the semiconductor layer 62*b*. Specifically, the thickness of the semiconductor layer 61*b* of the third embodiment is approximate to the sum of the thicknesses of the semiconductor layers 61*b* and 62*b* of the first embodiment.

The insulating layer 63*b*, the conductive layer 64*b*, and the conductive layer 65*b*, provided above the semiconductor layer 61*b*, are respectively derived from the same layers as, and have substantially the same thicknesses as, the insulating layer 63*a*, the conductive layer 64*a*, and the conductive layer 65*a*.

The structure of the gate electrode GCb of the third embodiment is the same as that of the first embodiment except for the absence of the semiconductor layer 62*b*.

In the low breakdown voltage transistor LTrN, the gate electrode GCc does not include a semiconductor layer which contains carbon (for example, the semiconductor layer 62*c*) between the semiconductor layer 61*c* and the insulating layer 63*c*. In other words, the insulating layer 63*c* is provided on the top surface of the semiconductor layer 61*c*.

The semiconductor layer 61*c* of the third embodiment is thicker than that of the first embodiment due to the absence of the semiconductor layer 62*c*. Specifically, the thickness of the semiconductor layer 61*c* of the third embodiment is approximate to the sum of the thicknesses of the semiconductor layers 61*c* and 62*c* of the first embodiment.

The insulating layer 63*c*, the conductive layer 64*c*, and the conductive layer 65*c*, provided above the semiconductor layer 61*c*, are respectively derived from the same layers as, and have substantially the same thicknesses as, the insulating layer 63*a*, the conductive layer 64*a*, and the conductive layer 65*a*.

The structure of the gate electrode GCc of the third embodiment is the same as that of the first embodiment except for the absence of the semiconductor layer 62*c*.

In the high breakdown voltage transistor HTrN, the gate electrode GCd does not include a semiconductor layer which contains carbon (for example, the semiconductor layer 62*d*) between the semiconductor layer 61*d* and the insulating layer 63*d*. In other words, the insulating layer 63*d* is provided on the top surface of the semiconductor layer 61*d*.

The semiconductor layer 61*d* of the third embodiment is thicker than that of the first embodiment due to the absence of the semiconductor layer 62*d*. Specifically, the thickness of the semiconductor layer 61*d* of the third embodiment is approximate to the sum of the thicknesses of the semiconductor layers 61*d* and 62*d* of the first embodiment.

The insulating layer 63*d*, the conductive layer 64*d*, and the conductive layer 65*d*, provided above the semiconductor layer 61*d*, are respectively derived from the same layers as, and have substantially the same thicknesses as, the insulating layer 63*a*, the conductive layer 64*a*, and the conductive layer 65*a*.

The structure of the gate electrode GCd of the third embodiment is the same as that of the first embodiment except for the absence of the semiconductor layer 62*d*.

[3-2] Advantages (Effects) of Third Embodiment

According to the semiconductor memory device 1 of the third embodiment, effects similar to those of the first embodiment can be obtained by a simpler structure.

Each gate electrode GC of the third embodiment includes the semiconductor layer 60, which contains carbon, in the lowermost layer of the gate electrode GC as in the first embodiment. Therefore, when the dopants, such as boron and phosphorus, are implanted from above, the effect of suppressing penetration of boron and phosphor into the semiconductor substrate side can be obtained in the same manner as in the first embodiment.

With regard to the effect of suppressing penetration of boron and phosphor into the conductive layer 64, the characteristic of the third embodiment will be described below. It is known that boron diffuses into the conductive layer 64 more noticeably as compared to phosphorus. Therefore, the control transistor VLTrP, which contains boron, has a structure including the semiconductor layer 62 and the insulating layer 63 as in the first embodiment, which prevents boron from diffusing into the conductive layer 64.

In contrast, the control transistors VLTrN, LTrN, and HTrN, which contain phosphorus, have a structure which does not include the semiconductor layer 62 and suppress penetration of phosphor into the conductive layer 64 only with the insulating layer 63. Since phosphorus diffuses into the conductive layer 64 less than boron as described above, the control transistors VLTrN, LTrN, and HTrN can produce effects similar to those of the first embodiment only with the insulating layer 63. Therefore, the control transistors VLTrN, LTrN, and HTrN, having simple structures, can suppress the diffusion of phosphorus into the conductive layer 64 to a minimum degree by the insulating layer 63.

Furthermore, since the semiconductor layer 61 can be formed to be thick due to the absence of the semiconductor layer 62, the operation speed of the transistor can be improved.

According to the semiconductor memory device 1 of the third embodiment, effects similar to those of the first embodiment can be obtained by a simpler structure.

[4] Other Modifications, Etc.

In the first to third embodiments, the configuration of the semiconductor memory device 1 may be different from the above-described configuration.

Herein, the term "couple" refers to electrical coupling, and does not exclude interposition of another component. Expressions such as "electrically coupled" cover insulator-interposed coupling, which allows for the same operation as electrical coupling without an insulator. Expressions such as "substantially the same", "practically the same", and "almost the same" allow for errors caused by manufacturing variations.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

The invention claimed is:

1. A semiconductor memory device comprising:
a memory cell; and
a P-type transistor, a first N-type transistor, a second N-type transistor, and a third N-type transistor provided on a top surface of a substrate and electrically coupled to the memory cell,
the P-type transistor including:
a first gate insulating layer provided on the substrate;
a first source region provided in the substrate;
a first drain region provided in the substrate; and
a first gate electrode provided on the first gate insulating layer,
the first gate electrode including:
a first semiconductor layer containing carbon;
a second semiconductor layer provided on the first semiconductor layer, the second semiconductor layer being a P-type;
a third semiconductor layer provided on the second semiconductor layer; and
a first conductive layer provided above the third semiconductor layer,
the first N-type transistor including:
a second gate insulating layer provided on the substrate;
a second source region provided in the substrate;
a second drain region provided in the substrate; and
a second gate electrode provided on the second gate insulating layer,
the second gate electrode including:
a fourth semiconductor layer containing carbon;
a fifth semiconductor layer provided on the fourth semiconductor layer, the fifth semiconductor layer being an N-type;
a sixth semiconductor layer provided on the fifth semiconductor layer and containing carbon; and
a second conductive layer provided above the sixth semiconductor layer,
the second N-type transistor including:
a third gate insulating layer provided on the substrate;
a seventh semiconductor layer provided above the third gate insulating layer and containing carbon;
an eighth semiconductor layer provided on the seventh semiconductor layer, the eighth semiconductor layer being the N-type; and
a ninth semiconductor layer provided on the eighth semiconductor layer and containing carbon,
the third N-type transistor including:
a fourth gate insulating layer provided on the substrate;
a tenth semiconductor layer provided above the fourth gate insulating layer and containing carbon;
an eleventh semiconductor layer provided on the tenth semiconductor layer, the eleventh semiconductor layer being the N-type; and
a twelfth semiconductor layer provided on the eleventh semiconductor layer and containing carbon,
the fourth gate insulating layer being thicker than the third gate insulating layer, and
the third gate insulating layer being thicker than the first gate insulating layer and the second gate insulating layer.

2. The semiconductor memory device according to claim 1, wherein:
the P-type transistor further includes a first insulating layer on the third semiconductor layer; and
the first N-type transistor further includes a second insulating layer on the sixth semiconductor layer.

3. The semiconductor memory device according to claim 1, wherein:
the P-type transistor further includes a third insulating layer in the second semiconductor layer; and
the first N-type transistor further includes a fourth insulating layer in the fourth semiconductor layer.

4. The semiconductor memory device according to claim 1, wherein:
the P-type transistor is a PMOS transistor; and
the first N-type transistor is an NMOS transistor.

5. The semiconductor memory device according to claim 1, wherein:
the first gate electrode includes:
a fifth gate insulating layer; and
a sixth insulating layer provided between the fifth gate insulating layer and the first semiconductor layer;
the P-type transistor further includes:
a first insulating layer provided between the third semiconductor layer and the first conductive layer; and
a third conductive layer provided above the first conductive layer;
the second gate electrode includes:
a seventh gate insulating layer; and
an eighth gate insulating layer provided between the seventh gate insulating layer and the fourth semiconductor layer; and
the first N-type transistor further includes:
a second insulating layer provided between the sixth semiconductor layer and the second conductive layer; and
a fourth conductive layer provided on the second conductive layer.

6. A semiconductor memory device comprising:
a memory cell; and
a P-type transistor, a first N-type transistor, a second N-type transistor, and a third N-type transistor provided on a top surface of a substrate and electrically coupled to the memory cell,
the P-type transistor including:
a first gate insulating layer provided on the substrate;
a first source region provided in the substrate;
a first drain region provided in the substrate; and
a first gate electrode provided on the first gate insulating layer,
the first gate electrode including:
a first semiconductor layer containing carbon;
a second semiconductor layer provided on the first semiconductor layer, the second semiconductor layer being a P-type;
a third semiconductor layer provided on the second semiconductor layer;
a first insulating layer provided on the third semiconductor layer; and
a first conductive layer provided on the first insulating layer,
the first N-type transistor including:
a second gate insulating layer provided on the substrate;
a second source region provided in the substrate;
a second drain region provided in the substrate; and
a second gate electrode provided on the second gate insulating layer, the second gate electrode including:
- a fourth semiconductor layer containing carbon;
- a fifth semiconductor layer provided on the fourth semiconductor layer, the fifth semiconductor layer being an N-type;
- a second insulating layer provided on the fifth semiconductor layer; and
- a second conductive layer provided on the second insulating layer, the second N-type transistor including:
- a third gate insulating layer provided on the substrate;
- a sixth semiconductor layer provided above the third gate insulating layer and containing carbon;
- a seventh semiconductor layer provided on e sixth semiconductor layer, the seventh semiconductor layer being an N-type; and the third N-type transistor including:
- a fourth gate insulating layer provided on the substrate;
- an eighth semiconductor layer provided above the fourth gate insulating layer and containing carbon; and
- a ninth semiconductor layer provided on the eighth semiconductor layer, the ninth semiconductor layer being the N-type, the fourth gate insulating layer being thicker than the third gate insulating layer, and the third gate insulating layer being thicker than the first gate insulating layer and the second gate insulating layer.

7. The semiconductor memory device according to claim 6, wherein:
- the P-type transistor further includes a third insulating layer in the second semiconductor layer; and
- the first N-type transistor further includes a fourth insulating layer in the fourth semiconductor layer.

8. The semiconductor memory device according to claim 6, wherein:
- the P-type transistor is a PMOS transistor; and
- the first N-type transistor is an NMOS transistor.

9. The semiconductor memory device according to claim 6, wherein:
the first gate electrode includes:
- a fifth gate insulating layer; and
- a sixth insulating layer provided between the fifth gate insulating layer and the first semiconductor layer;

the P-type transistor further includes a third conductive layer provided on the first conductive layer;

the second gate electrode includes:
- a seventh gate insulating layer; and
- an eighth gate insulating layer provided between the seventh gate insulating layer and the fourth semiconductor layer; and the first N-type transistor further includes a fourth conductive layer provided on the second conductive layer.

* * * * *